United States Patent [19]

Sasaki

[11] Patent Number: 5,698,462

[45] Date of Patent: Dec. 16, 1997

[54] METHOD FOR FABRICATING MICROWAVE SEMICONDUCTOR INTEGRATED CIRCUIT

[75] Inventor: Hajime Sasaki, Itami, Japan

[73] Assignee: Mitsubishi Denki Kabushiki Kaisha, Tokyo, Japan

[21] Appl. No.: 788,512

[22] Filed: Jan. 24, 1997

Related U.S. Application Data

[62] Division of Ser. No. 538,481, Oct. 3, 1995.

[30] Foreign Application Priority Data

Oct. 6, 1994 [JP] Japan .................................. 6-242972

[51] Int. Cl.$^6$ .................................................. H01L 21/70
[52] U.S. Cl. ........................... 437/51; 437/204; 437/215; 437/216
[58] Field of Search ........................ 437/51, 52, 60, 437/209, 215, 216, 222

[56] References Cited

U.S. PATENT DOCUMENTS

| | | | |
|---|---|---|---|
| 4,016,643 | 4/1977 | Pucel et al. | 29/571 |
| 4,992,764 | 2/1991 | Ayasli | 333/247 |
| 5,063,177 | 11/1991 | Geller et al. | 437/215 |
| 5,521,123 | 5/1996 | Komatsu et al. | 437/209 |
| 5,543,364 | 8/1996 | Stupian et al. | 437/215 |
| 5,548,099 | 8/1996 | Cole, Jr. et al. | 437/209 |
| 5,559,046 | 9/1996 | Oishi et al. | 437/39 |

FOREIGN PATENT DOCUMENTS

| | | |
|---|---|---|
| 3126249 | 5/1991 | Japan. |
| 3211870 | 9/1991 | Japan. |

*Primary Examiner*—Kevin Picardat
*Attorney, Agent, or Firm*—Leydig, Voit & Mayer, LTD.

[57] ABSTRACT

A method of fabricating a microwave semiconductor integrated circuit includes fabricating an integrated circuit including an FET and a wiring surrounding the FET on the front surface of the substrate; forming an insulating film covering a first region of the substrate where the FET is fabricated and a second region of the substrate where the wiring is fabricated; forming a thin resist film on the insulating film covering the first region of the substrate; removing a portion of the insulating film from the second region of the substrate opposite the wiring; forming a metal film containing a gas, covering the thin resist film and contacting, at a peripheral portion, the wiring exposed by removal of the insulating film; forming a hole in from the rear surface of the substrate to reach the thin resist film; forming a space between the metal film and the insulating film by dissolving the thin resist film with a solvent applied through the hole; closing the opening of the hole at the rear surface of the substrate; heating the metal film to make the metal film discharge the gas, thereby expanding the metal film to such an extent that a space produced between the metal film and the gate electrode of the FET does not cause parasitic capacitance between the metal film and the gate electrode.

10 Claims, 17 Drawing Sheets

METHOD FOR FABRICATING MICROWAVE SEMICONDUCTOR INTEGRATED CIRCUIT

This disclosure is a division of patent application Ser. No. 08/538,481, filed Oct. 3, 1995.

FIELD OF THE INVENTION

The present invention relates to a microwave semiconductor integrated circuit and a fabricating method therefor and, more particularly, to a technique for improving protection of an FET included in the integrated circuit from the environment for electromagnetic shielding of the FET.

BACKGROUND OF THE INVENTION

FIG. 37 is a perspective view illustrating a prior art monolithic microwave integrated circuit (hereinafter referred to as MMIC) in which an MMIC chip is encapsulated in a metal base package. FIG. 38 is a cross-sectional view taken along a line 38—38 in FIG. 37. In these figures, an MMIC 1000 includes a package substrate 7 made of CuW or the like. A pair of ceramic layers 5A and 5B are adhered to prescribed positions on the upper surface of the package substrate 7 with Kovar which is an alloy of Fe(54%), Ni(29%), and Co(17%). Metal-foil patterns 5a serving as microwave or DC input/output (I/O) terminals are disposed on the upper surface of the ceramic layers 5A and 5B. A GaAs MMIC chip 1 is adhered to a region of the upper surface of the package substrate 7 between the ceramic layers 5A and 5B with solder. The metal-foil patterns 5a on the ceramic layers 5A and 5B are connected to wiring patterns (not shown) on the GaAs MMIC chip I with wires 6. A package frame 4 made of CuW or the like and having slots at opposite side walls is adhered to a prescribed position on the upper surface of the package substrate 7 with Kovar so that the ceramic layers 5A and 5B are fitted in the slots of the frame 4. A package lid 3 comprising CuW or the like is adhered to the upper surface of the package frame 4 with solder. In the figures, reference numeral 2 designates an FET included in the GaAs MMIC chip 1. The GaAs MMIC chip 1 includes other circuit elements, such as resistors and capacitors, although these elements are not shown in the FIG. 38.

A description is given of the operation.

For example, when the GaAs MMIC chip 1 is an amplifier, a microwave signal is input to the GaAs MMIC chip 1 through the metal-foil pattern 5a on the ceramic layer 5A and the wire 6. This input signal is amplified by the FET 2 included in the MMIC chip 1 and, thereafter, it is output through the wire 6 and the metal-foil pattern 5a on the ceramic layer 5B to the outside. The metal base package comprising the package substrate 7, the frame 4, the lid 3, and the ceramic layers 5A and 5B protects the circuit elements included in the MMIC chip 1 from the environment, especially humidity, end electromagnetically shields the FET 2 and other the circuit elements, in other words, a microwave closed space is produced, whereby the circuit elements in the MMIC chip 1, especially the FET that is the most important element, are desirably operated with high stability.

The above-described MMIC 1000 is assembled by connecting a plurality of package parts, i.e., the substrate 7, the frame 4, the lid 3, and the ceramic layers 5A and 5B, using a high-temperature adhesive, such as solder or Kovar. Therefore, a plurality of expensive metals are required to produce the MMIC. In addition, processing of each metal is not easy. Further, the assembly is complicated and the efficiency of the assembly is very poor. As a result, the cost of the device is undesirably increased.

SUMMARY OF THE INVENTION

It is an object of the present invention to provide a microwave semiconductor integrated circuit that operates as stably as the prior art microwave semiconductor integrated circuit without using an expensive metal base package.

It is another object of the present invention to provide a relatively simple method for fabricating the microwave semicondutor integrated circuit.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a microwave semiconductor integrated circuit comprises a semiconductor substrate; an integrated circuit disposed on the semiconductor substrate and including at least an FET as a circuit element; and a dome-shaped metal film disposed on the semiconductor substrate and insulating the FET from external environment. In this structure, the FET is protected from external environment and electromagnetically shielded by the dome-shaped metal film without producing parasitic capacitance between a gate electrode of the FET and the dome-shaped metal film. As a result, the FET operates stably for a long period.

According to a second aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin resist film on the insulating film covering the first region of the semiconductor substrate; removing a portion of the insulating film on the second region of the semiconductor substrate and opposite to the wiring; forming a metal film containing a gas and discharging the gas to the outside in the following heat treatment, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the insulating film by dissolving and removing the thin resist film with a solvent applied to the resist film through the hole; closing the opening of the hole at the rear surface of the semiconductor substrate; heating the metal film to make the metal film discharge the gas, thereby expanding the metal film to such an extent that a space produced between the metal film and the gate electrode of the FET does not cause parasitic capacitance between the metal film and the gate electrode.

According to a third aspect of the present invention, the above-described method includes forming the metal film by selectively forming a Pd/Ni/Au film on the insulating film using electroless plating.

According to a fourth aspect of the present invention, the above-described method includes forming the metal film by selectively forming a Ti/Au layer on the insulating film by vapor deposition under hydrogen atmosphere.

In the above-described fabricating method according to the second to fourth aspects of the invention, a microwave semiconductor integrated circuit in which an FET is protected from external environment and electromagnetically shielded is fabricated in wafer process. Therefore, a microwave semiconductor integrated circuit that operates stably for a long period is obtained at low material cost and high efficiency compared to the prior art microwave semiconductor integrated circuit sealed in a metal base package. In addition, since the metal film expands by discharging gas contained in that film, it is not necessary to provide a gas generating film or an external apparatus for expanding the metal film.

According to a fifth aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin film comprising one selected from a semiconductor and an organic substance on part of the insulating film covering the first region of the semiconductor substrate, the thin film containing a gas and discharging the gas in the following heat treatment; forming a thin resist film on the thin semiconductor or organic substrate film; removing a portion of the insulating film on the second region of the semiconductor substrate and opposite to the wiring; forming a metal film, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the thin semiconductor or organic substance film by dissolving and removing the thin resist film with a solvent applied to the resist film through the hole; closing the opening of the hole at the rear surface of the semiconductor substrate; and heating the thin semiconductor or organic substance film to make that thin film discharge the gas, thereby expanding the metal film to such an extent that a space produced between the metal film and the gate electrode of the FET does not cause parasitic capacitance between the metal film and the gate electrode.

According to a sixth aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin resist film on the insulating film covering the first region of the semiconductor substrate; removing a portion of the insulating film on the second region of the semiconductor substrate and opposite to the wiring; forming a metal film, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the insulating film by dissolving and removing the thin resist film with a solvent applied to the resist film through the hole; injecting a high-pressure gas into the space from the hole, thereby expanding the metal film to an extent that a space produced between the metal film and the gate electrode of the FET does not cause parasitic capacitance between the metal film and the gate electrode; and closing the opening of the hole at the rear surface of the semiconductor substrate.

According to a seventh aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin resist film on the insulating film covering the first region of the semiconductor substrate; removing a portion of the insulating film on the second region of the semiconductor substrate and opposite to the wiring; forming a metal film, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the insulating film by dissolving and removing the thin resist film with a solvent applied to the resist film through the hole; closing the opening of the hole at the rear surface of the semiconductor substrate; and heating the substrate to expand the space between the metal film and the insulating film, thereby expanding the metal film to such an extent that a space produced between the metal film and the gate electrode of the FET does not cause parasitic capacitance between the metal film and the gate electrode.

According to an eighth aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin resist film on the insulating film covering the first region of the semiconductor substrate; removing a portion of the insulating film on the second region of the semiconductor substrate and opposite to the wiring; forming a metal film, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the insulating film by dissolving and removing the thin resist film with a solvent applied to the resist film through the hole; bonding a wire to the metal film and pulling the wire to expand the metal film to such an extent that a space produced between the metal film and the gate electrode of the FET does not cause parasitic capacitance between the metal film and the gate electrode; and closing the opening of the hole at the rear surface of the semiconductor substrate.

According to a ninth aspect of the present invention, a method of fabricating a microwave semiconductor integrated circuit comprises preparing a semiconductor substrate having opposite front and rear surfaces; fabricating an integrated circuit including an FET having a gate electrode as a circuit element and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a resist film on part of the insulating film covering the first region of the semiconductor substrate, the resist film having a thickness that provides such a space between the gate electrode of the FET and a metal film which is later formed on the resist film that does not cause parasitic capacitance between the gate electrode and the metal film; removing a portion of the insulating film on the second region of the semiconductor substrate and opposite to the wiring; forming the metal film, covering the thin resist film and contacting, at a peripheral portion, the wiring that is exposed by the removal of the insulating film; forming a hole in a prescribed region of the semiconductor substrate from the rear surface of the semiconductor substrate to reach the thin resist film; forming a space between the metal film and the insulating film by dissolving and removing the thin resist film with a solvent applied to the resist film through the hole; and closing the opening of the hole at the rear surface of the semiconductor substrate.

According to a tenth aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a resist film on part of the insulating film other than part on the wiring, the resist film having a thickness that provides such a space between the gate electrode of the FET and a thin first metal film which is later formed on the resist film that does not cause parasitic capacitance between the gate electrode and the metal film; using the resist film as a mask, removing a portion of the insulating film on the wiring; forming the thin first metal film on the resist film and on the wiring which is exposed by the removal of the insulating film by vapor deposition and, thereafter, forming a thick second metal film by electroplating using the first metal film as a feeding layer; patterning the first and second metal films in a size a little larger than the first region of the semiconductor substrate; removing a peripheral portion of the patterned second metal film, the portion being located outside the first region of the substrate and not located on the wiring; dissolving and removing the resist film with a solvent; and bending a peripheral portion of the first metal film that is not located within the first region of the substrate to make a space insulated from external environment between the insulating film and the first metal film.

According to an eleventh aspect of the present invention, a method of fabricating a microwave semiconductor integrated circuit comprises preparing a semiconductor substrate having opposite front and rear surfaces; fabricating an integrated circuit including an FET having a gate electrode and a wiring surrounding the FET on the front surface of the semiconductor substrate, the FET being fabricated on a first region of the semiconductor substrate and the wiring being fabricated on a second region of the semiconductor substrate surrounding the first region; forming an insulating film covering the first region of the semiconductor substrate where the FET is fabricated and the second region of the semiconductor substrate where the wiring is fabricated; forming a thin resist film on a portion of the insulating film covering the first region of the substrate; forming a metal film pattern comprising a first metal film having a thermal expansion coefficient and a second metal film having a thermal expansion coefficient larger than that of the first metal film, covering the thin resist film and contacting, at a peripheral portion, the wiring exposed by the removal of the insulating film; forming a hole in a prescribed region of the semiconductor substrate from the rear surface of the semiconductor substrate to reach the thin resist film; forming a space between the metal film pattern and the insulating film by dissolving and removing the thin resist film with a solvent applied to the resist film through the hole; closing the opening of the hole at the rear surface of the semiconductor substrate; and heating the metal film pattern to expand the metal film pattern to such an extent that a space produced between the metal film pattern and the gate electrode of the FET does not cause parasitic resistance between the metal film pattern and the gate electrode.

In the above-described fabricating methods according to the fifth to eleventh aspects of the invention, a microwave semiconductor integrated circuit in which an FET is protected from external environment and electromagnetically shielded is fabricated in wafer process. Therefore, a microwave semiconductor integrated circuit that operates stably for a long period is obtained at low material cost and high efficiency compared to the prior art microwave semiconductor integrated circuit sealed in a metal base package. In addition, in the fabricating methods according to the ninth and tenth aspects of the invention, since the space between the gate electrode of the FET and the FET protecting metal film is determined by the thickness of the resist film, it is possible to accurately make this space such that no parasitic capacitance is produced between the gate electrode and the metal film.

DETAILED DESCRIPTION OF THE PREFERRED EMBODIMENT

[Embodiment 1]

Figure 1:
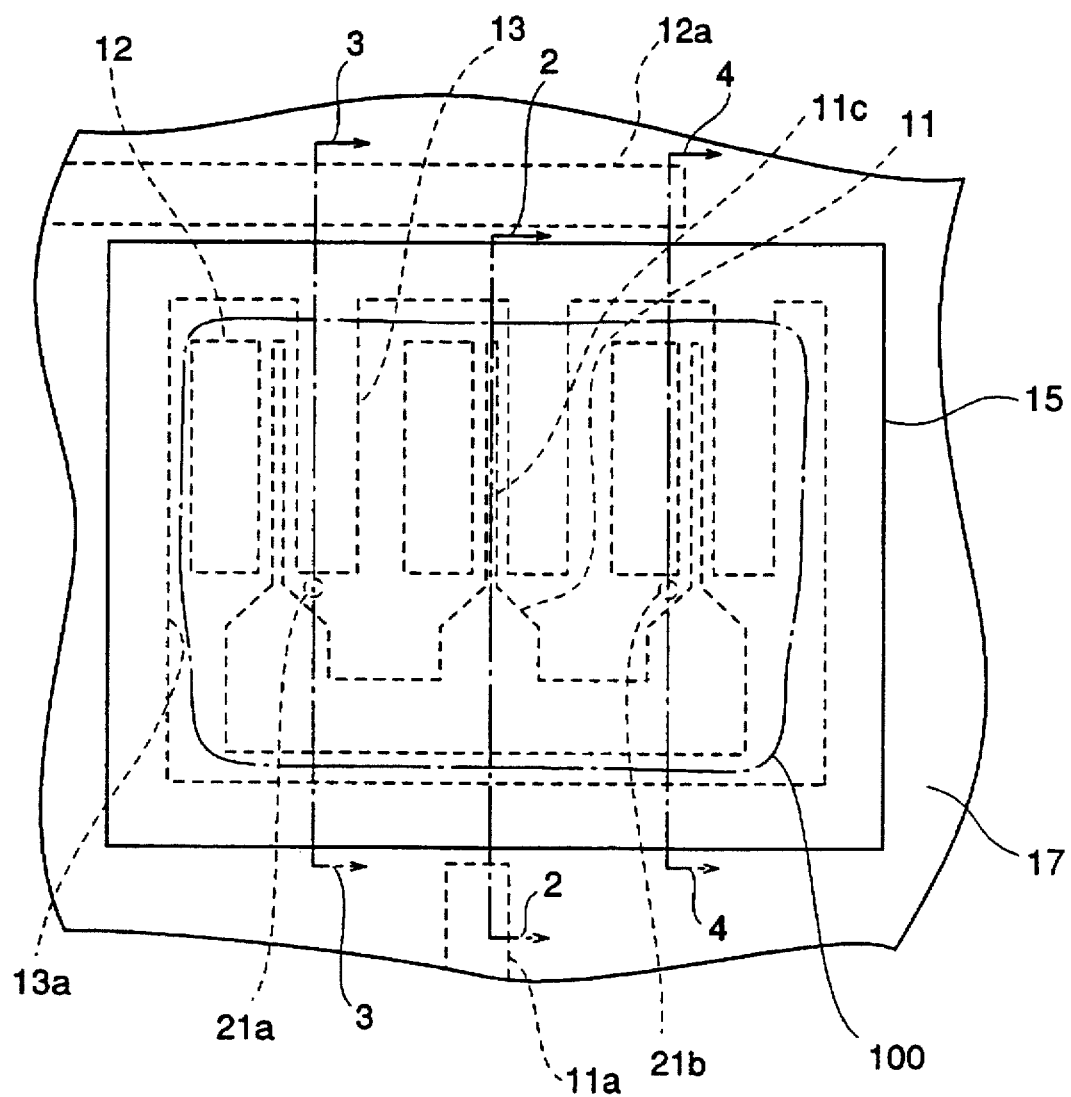
FIG. 1 is a perspective plan view illustrating an FET included in an MMIC and a peripheral region thereof in accordance with a first embodiment of the present invention.
Figure 2:
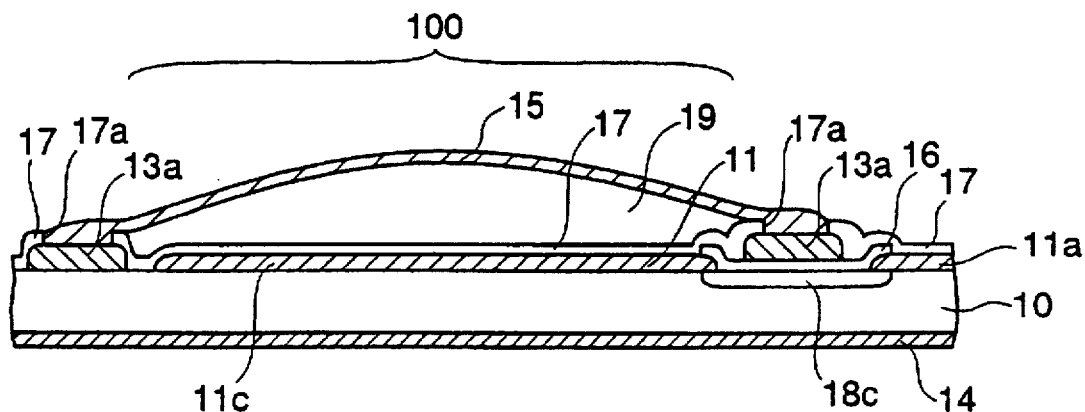
FIG. 2 is a cross-sectional view taken along a line 2—2 in FIG. 1.
Figure 3:
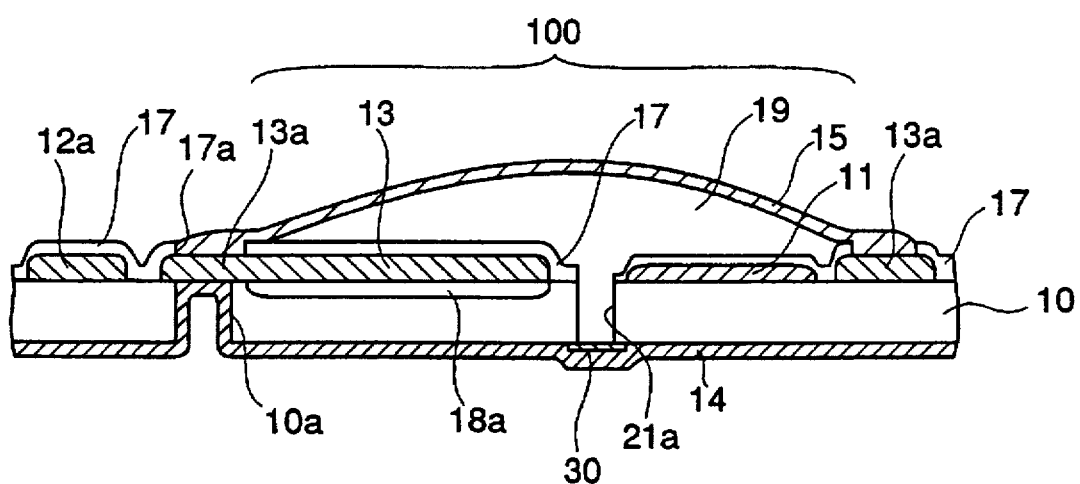
FIG. 3 is a cross-sectional view taken along a line 3—3 in FIG. 1.
Figure 4:
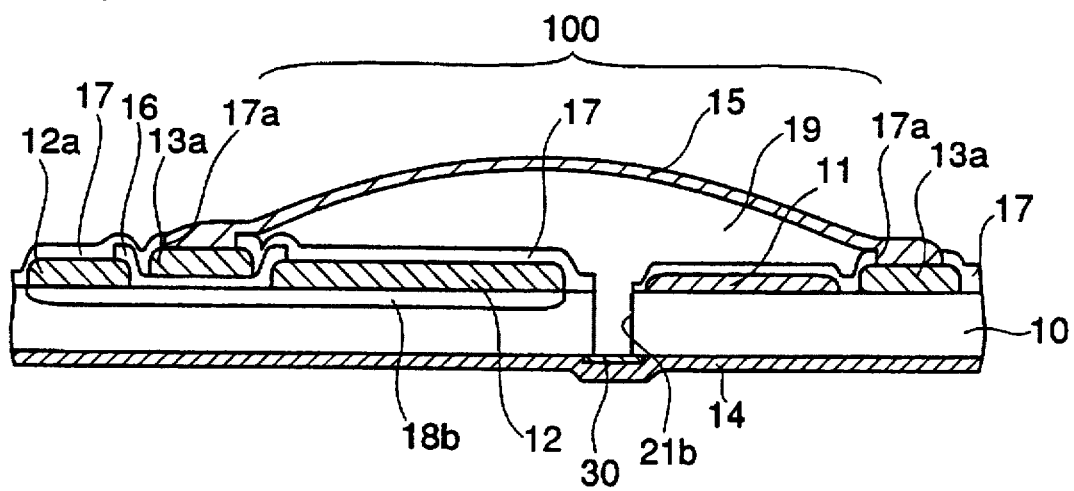
FIG. 4 is a cross-sectional view taken along a line 4—4 in FIG. 1.

FIG. 1 is a perspective plan view illustrating an FET included in an MMIC and a peripheral region thereof in accordance with a first embodiment of the present invention. FIGS. 2, 3, and 4 are cross-sectional views taken along lines 2—2, 3—3, and 4—4 in FIG. 1, respectively. In these figures, reference numeral 10 designates a GaAs substrate and reference numeral 100 designates an FET fabricated on the GaAs substrate 10.

The FET 100 comprises first and second $n^+$ diffused regions 18a and 18b in the GaAs substrate 10 and reaching the surface of the substrate, a gate electrode 11 having a finger part 11c, a drain electrode 12 disposed on the second $n^+$ diffused region 18b, and a source electrode 13 disposed on the first $n^+$ diffused region 18a. The finger part 11c of the gate electrode 11 is located between the source electrode 13 and the drain electrode 12. The gate electrode 11, the drain electrode 12, the source electrode 13, and the surface of the substrate 10 surrounding these electrodes are covered with an $SiO_2$ film 17. Reference numerals 21a and 21b designate holes penetrating through the substrate 10. These holes are closed at the rear surface of the substrate 10 with a thin metal film 22, such as an Au ribbon. Reference numeral 22 designates a grounding conductor film comprising, for example, Au.

In the vicinity of the FET 100, a source electrode wiring 13a is disposed on the surface of the GaAs substrate 10, extending from the source electrode 13 and surrounding the FET 100. Reference numerals 11a and 12a designate a gate electrode wiring and a drain electrode wiring, respectively. An $n^+$ diffused region 18c is present in the GaAs substrate 10 reaching the surface of the substrate. An end of the gate electrode 11 is connected to a first end of the $n^+$ diffused region 18c and an end of the gate electrode wiring 11a is connected to a second end, opposite the first end, of that region 18c. A center portion of the $n^+$ diffused region 18c, the end portion of the gate electrode 11, and the end portion of the gate electrode wiring 11a are covered with an $SiO_2$ film 16, and a portion of the source electrode wiring 13a is disposed on the $SiO_2$ film 16. The $n^+$ diffused region 18b extends to the vicinity of the FET 100 on the GaAs substrate 10, and a part of the drain electrode wiring 12a is disposed on the $n^+$ diffused region 18b. A part of the source electrode wiring 13a is located on and separated from the $n^+$ diffused region 18b by the $SiO_2$ film 16. A part of the source electrode wiring 13a contacting the source electrode 13 is connected to a ground wiring 14 on the rear surface of the GaAs substrate 10 through a contact hole 10a in the GaAs substrate 10. The gate electrode wiring 11a, the drain electrode wiring 12a, the source electrode wiring 13a, and the surface of the substrate 10 surrounding these wirings are covered with an SiO₂ film 17.

The FET 100 is covered with a dome-shaped metal film 15 for protecting the FET. The peripheral edge of the dome-shaped metal film 15 is connected to the upper surface of the source electrode wiring 13a through an opening 17a of the SiO₂ film 17. The FET 100 is protected from external environment and electromagnetically shielded by the metal film 15. A space 19 is present between the FET protecting metal film 15 and the SiO₂ film 17. The distance from the metal film 15 to the SiO₂ film 17 is selected so that no parasitic capacitance, i.e., no gate to source capacitance, is produced between the metal film 15 and the gate electrode 11 of the FET 100.

Although only the FET 100 is shown in the figures, circuit elements other than the FET, such as capacitors and resistors, are disposed on a region of the GaAs substrate 10 that is not shown in the figures.

Figure 20:
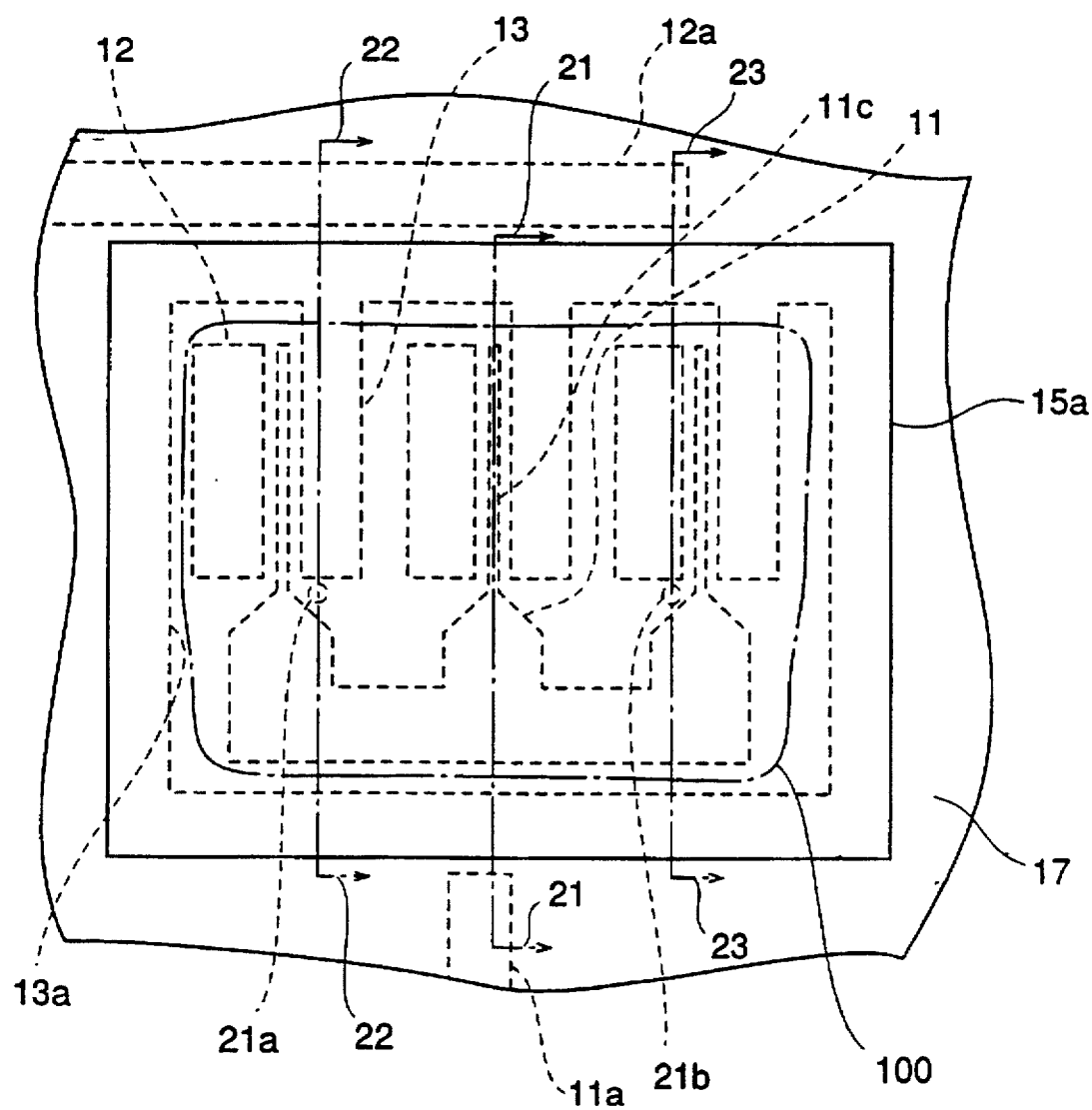
FIG. 20 is a perspective plan view illustrating an FET included in an MMIC and a peripheral region thereof in accordance with a sixth embodiment of the present invention.

The operation of this MMIC is fundamentally identical to the operation of the prior art MMIC functioning as an amplifier shown in FIG. 20. That is, a microwave signal is input to the MMIC through a signal input wiring (not shown) which is disposed on a region of the substrate 10 outside the region shown in the figures. This input signal is amplified by the FET 100 and then output to the outside through a signal output wiring (not shown) which is disposed on a region of the substrate 10 outside the region shown in the figures. During the operation of the MMIC, the dome-shaped FET protecting metal film 15 performs the same function as the metal base package of the prior art MMIC, i.e., it protects the FET 100 from the environment, especially humidity, and electromagnetically shields the FET 100, in other words, it produces a closed space. As a result, the MMIC is desirably operated at high stability for a long period.

A description is given of the fabricating process.

Figure 5:
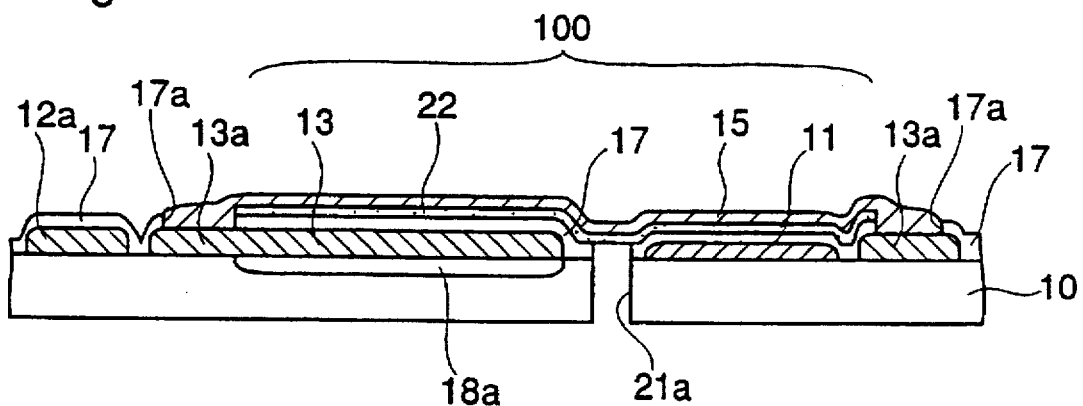
FIGS. 5 and 6 are cross-sectional views illustrating process steps in a method of fabricating the MMIC shown in FIG. 1.
Figure 6:
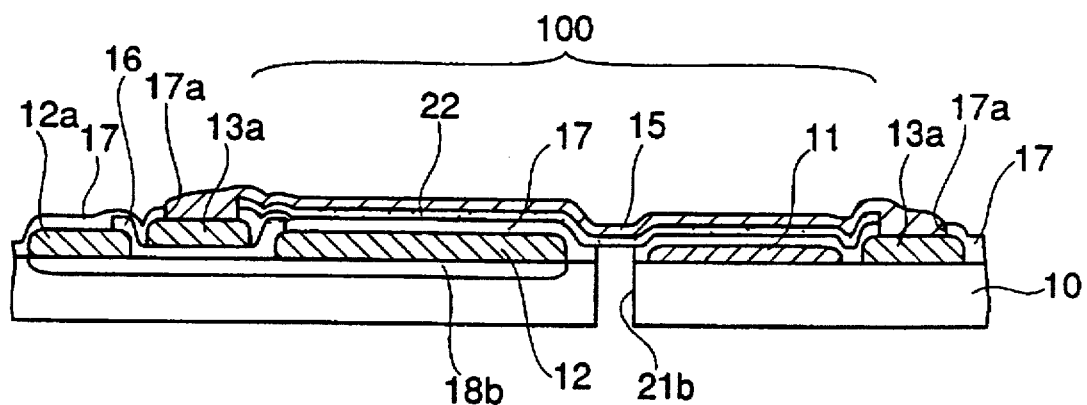

FIGS. 5 and 6 are cross-sectional views taken along the lines 3—3 and 4—4 in FIG. 1, respectively, illustrating process steps in a method of fabricating the MMIC according to the first embodiment of the invention.

Initially, the n⁺ diffused regions 18a and 18c are formed in prescribed regions of the GaAs substrate 10, reaching the surface of the substrate.

Next, a metal film comprising Al or WSi and having a thickness of 2000–4000 Å is deposited on the substrate 10 by vapor deposition and patterned to form the gate electrode 11 and the gate electrode wiring 11b.

Next, a metal film comprising AuGe/Ni/Au and having a thickness of 5000Å–3 μm is deposited by vapor deposition and patterned to form the drain electrode 12 and the drain electrode wiring 12a.

Then, an SiO₂ film 16 2000–3000 Å thick is formed on portions of the n⁺ diffused regions 18b and 18c, which portions intersect a source electrode wiring 13a that is later formed.

Thereafter, a metal film comprising AuGe/Ni/Au and having a thickness of 5000Å–3 μm is deposited by vapor deposition and patterned to form the source electrode 13 and the source electrode wiring 13a.

Then, an SiO₂ film 17 2000–3000 Å thick is formed over the entire surface of the GaAs substrate 10 covering the above-described electrodes 11 to 13 and the electrode wirings 11b, 12a, and 13a. Thereafter, a portion of the SiO₂ film 17 on the surface of the source electrode wiring 13a is selectively etched and removed.

Then, a thin resist film 22 having a thickness in a range from several tens of angstroms to 1 micron is selectively formed on a portion of the SiO₂ film 17 covering the FET 100, i.e., a portion surrounded by the exposed source electrode wiring 13a.

Then, a metal film comprising Pd(10–5000 Å)/Ni (10–5000 Å)/Au(1000 Å) is formed by electroless plating at a temperature exceeding 40° C. and, thereafter, this metal film is etched except a portion contacting the exposed surface of the source electrode wiring 13a and a portion covering the FET 100, thereby producing the FET protecting metal film 15.

Next, prescribed portions of the GaAs substrate 10 and the SiO₂ film 17 between the gate electrode 11 and the source electrode 13 and between the gate electrode 11 and the drain electrode 12 are etched from the rear surface of the substrate 10 to form holes 21a and 21b penetrating through the substrate 10 and the SiO₂ film 17 and reaching the thin resist film 22, resulting in the structure shown in FIGS. 5 and 6.

Next, a solvent that can dissolve the resist film 22 is injected into one of the holes 21a and 21b and discharged from the other of the holes to completely remove the thin resist film 22, whereby a space is formed between the FET protecting metal film 15 and the SiO₂ film 17.

Next, a thin metal film 30, such as an Au ribbon, is bonded to the rear surface of the GaAs substrate 10 to close the openings of the holes 21a and 22b at the rear surface of the substrate 10. Thereafter, the FET protecting metal film 15 is subjected to heat treatment at a temperature exceeding 200° C. for several hours. As a result of the heat treatment, the FET protecting metal film 15 is expanded like a dome, whereby a space 19 is produced between the metal film 15 and the SiO₂ film 17. The degree of the expansion of the FET protecting metal film 15 is controlled by the deposition temperatures for the Pd film and the Ni film. The reason why the Pd/Ni/Au metal film 15 produced by the electroless plating is expanded by the heat treatment is that the Pd film and the Ni film occlude hydrogen when these films are deposited and discharge the hydrogen when subjected to heat treatment. In addition, the reason why the degree of the expansion can be controlled by the deposition temperatures of the Pd film and the Ni film is that quantity of the occluded hydrogen varies according to these temperatures.

Next, a contact hole 10a is formed in a prescribed region of the GaAs substrate 10 from the rear surface of the substrate and, thereafter, a grounding metal film 14 comprising Au is formed on the rear surface of the GaAs substrate 10, thereby completing the MMIC shown in FIGS. 1 to 4 according to the first embodiment of the present invention.

In the above-described fabricating process of an MMIC, the FET 100 fabricated in a prescribed region of the GaAs substrate 10 is protected from the environment and electromagnetically shielded by the FET protecting metal film 15 which is formed on the GaAs substrate 10 after the formation of the FET. Therefore, an MMIC that operates as stably as the prior art MMIC sealed in the metal base package for protection from the environment and for electromagnetic shielding is fabricated in a relatively simple process, compared to the prior art process, without using expensive parts.

While in the above-described first embodiment the contact hole 10a and the grounding metal film 14 are formed after the heat treatment of the FET protecting metal film 15, the contact hole and the metal film may be formed before the heat treatment.

[Embodiment 2]

Figure 7:
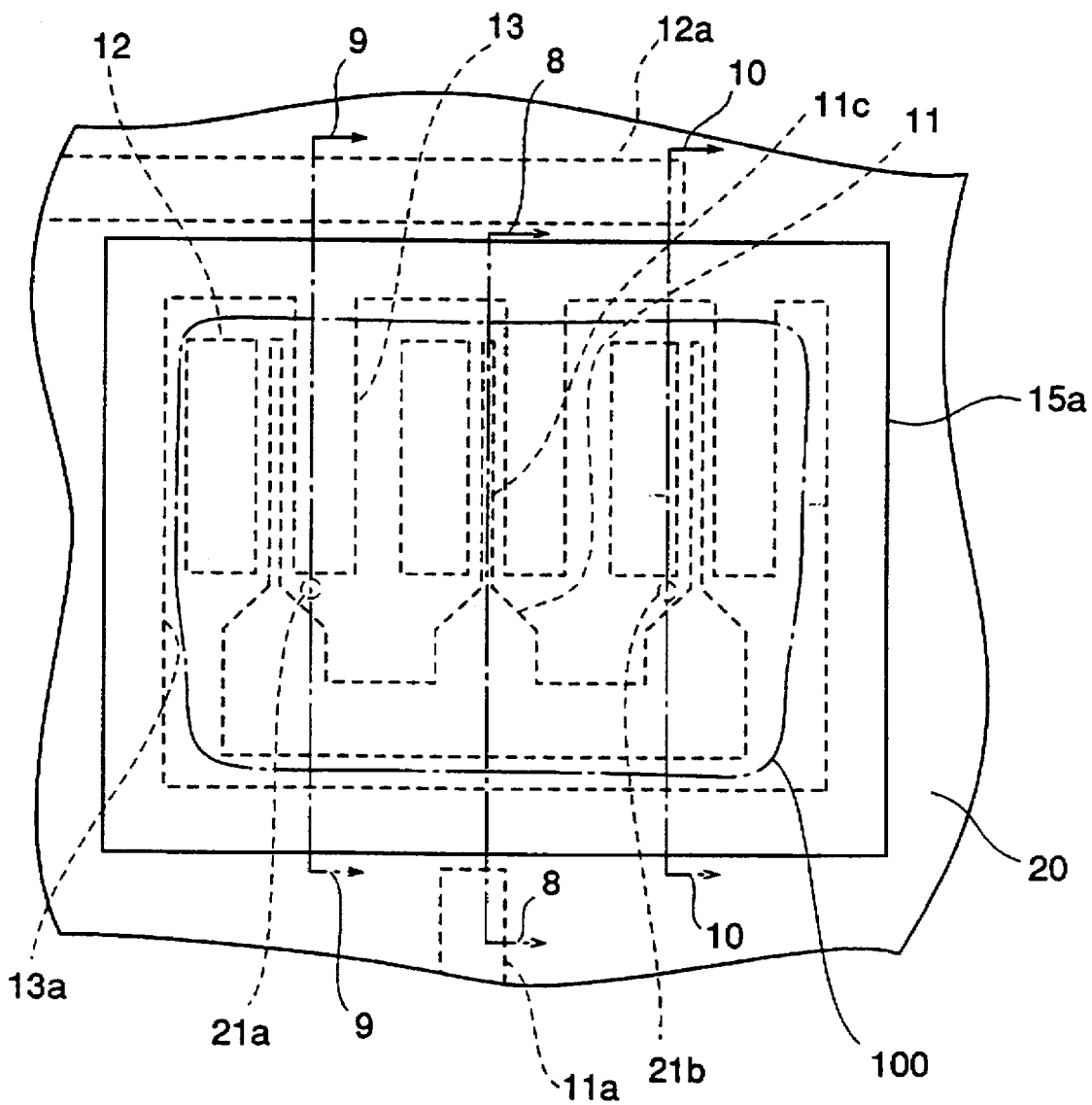
FIG. 7 is a perspective plan view illustrating an FET included in an MMIC and a peripheral region thereof in accordance with a second embodiment of the present invention.
Figure 8:
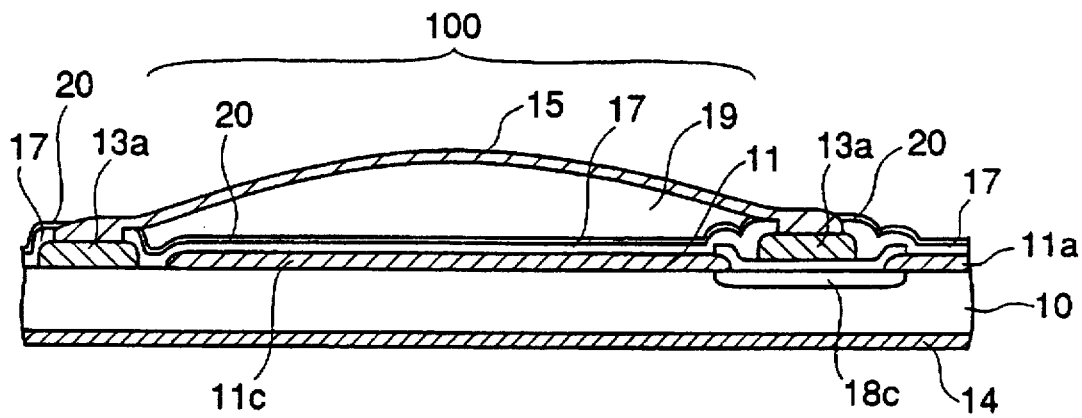
FIG. 8 is a cross-sectional view taken along a line 8—8 in FIG. 7.
Figure 9:
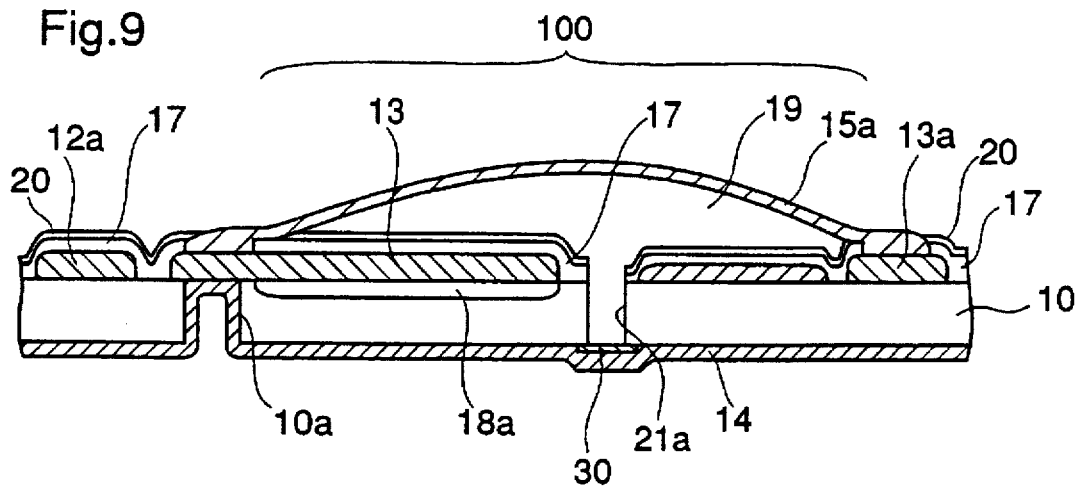
FIG. 9 is a cross-sectional view taken along a line 8—8 in FIG. 7.
Figure 10:
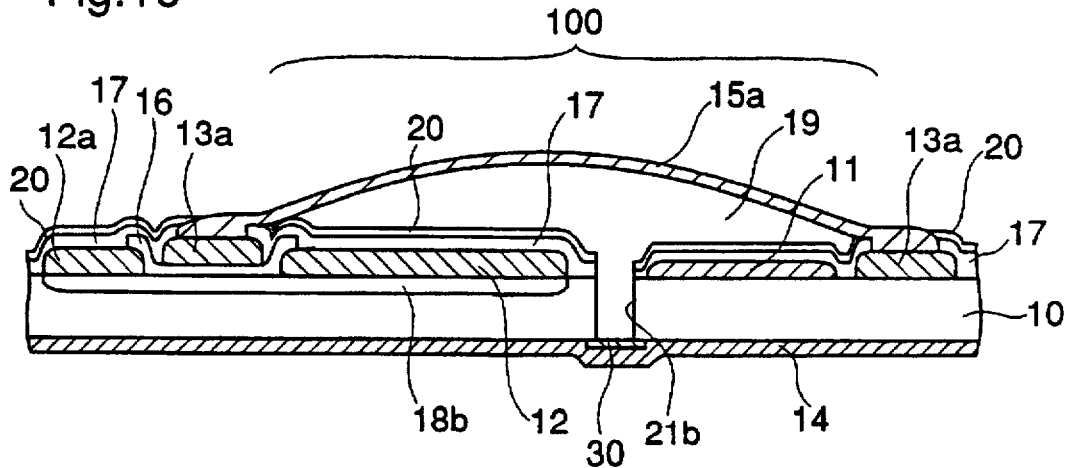
FIG. 10 is a cross-sectional view taken along a line 10—10 in FIG. 7.

FIG. 7 is a perspective plan view illustrating an FET included in an MMIC and a peripheral region thereof in accordance with a second embodiment of the present invention. FIGS. 8, 9, and 10 are cross-sectional views taken along lines 8—8, 9—9, and 10—10 in FIG. 7, respectively. In these figures, the same reference numerals as those in FIGS. 1 to 4 designate the same or corresponding parts. Reference numeral 15a designates an FET protecting metal film and reference numeral 20 designates an amorphous silicon film.

Since the operation of the MMIC according to this second embodiment is identical to the operation of the MMIC according to the first embodiment, repeated description is not necessary.

Figure 11:
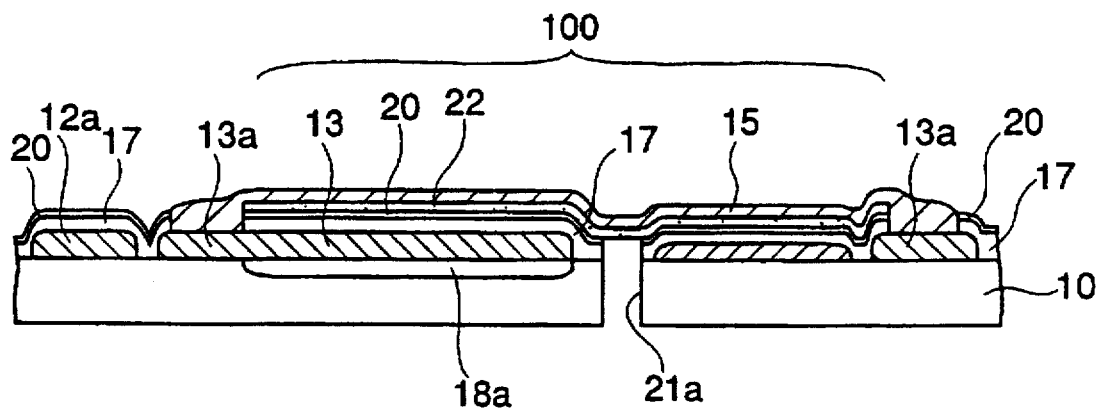
FIGS. 11 and 12 a cross-sectional views illustrating process steps in a method of fabricating the MMIC in accordance with the second embodiment of the present invention.
Figure 12:
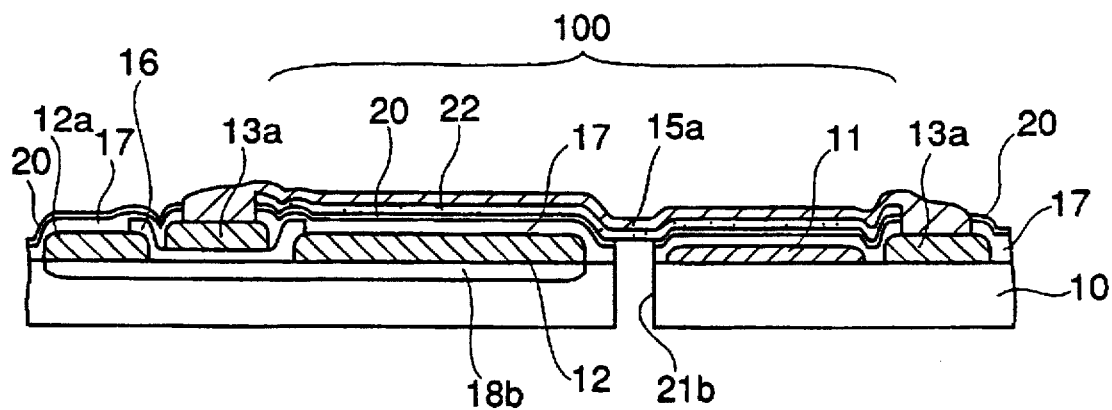

A description is given of the fabricating process of the MMIC. FIGS. 11 and 12 are cross-sectional views taken along the lines 5—5 and 6—6 in FIG. 1, respectively, illustrating process steps in a method of fabricating the MMIC according to the second embodiment of the invention.

The process steps until the formation of the $SiO_2$ film 17 are identical to those already described for the first embodiment of the invention.

After formation of the $SiO_2$ film 17, an amorphous silicon film 20 having a thickness in a range from several tens of angstroms to 2 microns is formed on the $SiO_2$ film 17 by plasma CVD. Thereafter, portions of the $SiO_2$ film 17 and the amorphous silicon film 20 on the upper surface of the source electrode wiring 13a are selectively etched and removed.

Next, a thin resist film 22 is selectively formed on a portion of the amorphous silicon film 20 covering the FET 100, i.e., a portion surrounded by the exposed source electrode wiring 13a.

Then, a metal film comprising Ti(10–200 Å)/Au(1 μm) is deposited by vapor deposition, and this metal film is etched and removed except for a portion contacting the exposed surface of the source electrode wiring 13a and a portion covering the FET 100, thereby producing the FET protecting metal film 15a.

Next, prescribed portions of the substrate 10, the $SiO_2$ film 17, and the amorphous silicon film 20 between the gate electrode 11 and the source electrode 13 and between the gate electrode 11 and the drain electrode 12 are etched from the rear surface of the substrate 10 to produce holes 21a and 21b penetrating through the substrate 10, the $SiO_2$ film 17, and the amorphous silicon film 20 and reaching the thin resist film 22, resulting in the structure shown in figures 11 and 12.

Next, a solvent that can dissolve the resist film 22 is injected into one of the holes 21a and 21b and discharged from the other of the holes to completely remove the thin resist film 22, whereby a space is formed between the FET protecting metal film 15a and the amorphous silicon film 20.

Next, a thin metal film 30 is bonded to the rear surface of the GaAs substrate 10 to close the openings of the holes 21a and 22b at the rear surface of the substrate 10. Thereafter, the FET protecting metal film 15a is subjected to heat treatment at a temperature exceeding 400° C. for several minutes. During the heat treatment, the amorphous silicon film 20 beneath the FET protecting metal film 15a is heated and discharges hydrogen (about 10–30 arm %). As a result of the discharge of hydrogen, the FET protecting metal film 15a is expanded like a dome as shown in FIGS. 8 to 10, whereby a space 19 is produced between the FET protecting metal film 15a and the amorphous silicon film 20.

Then, a contact hole 10a is formed in a prescribed region of the GaAs substrate 10 from the rear surface of the substrate 10 and, thereafter, a grounding conductor 14 is formed on the rear surface of the GaAs substrate 10, thereby completing the MMIC shown in FIGS. 7 to 10 according to the second embodiment of the present invention.

In the above-described fabricating process for an MMIC, the FET protecting metal film 15a that protects the FET 100 from the environment and electromagnetically shields the FET 100 is produced in a wafer stage process. Therefore, an MMIC that operates as stably as the prior art MMIC sealed in the metal base package for protection from the environment and for electromagnetic shielding is fabricated in a relatively simple process, compared to the prior art process, without using expensive parts.

Although in this second embodiment of the invention the amorphous silicon film 20 is formed on the $SiO_2$ film 17, a wax may be applied to the $SiO_2$ film 17 to a thickness ranging from several tens of angstroms to one micron in place of the amorphous silicon film 20. Also in this case, since the wax discharges an entrained gas or produces a gas by decompoition when it is heated, the same effects as described above are achieved.

While in this second embodiment of the invention the contact hole 10a and the grounding metal film 14 are formed after the heat treatment of the amorphous silicon film 20, the hole and the metal film may be formed before the heat treatment.

[Embodiment 3]

Figure 13:
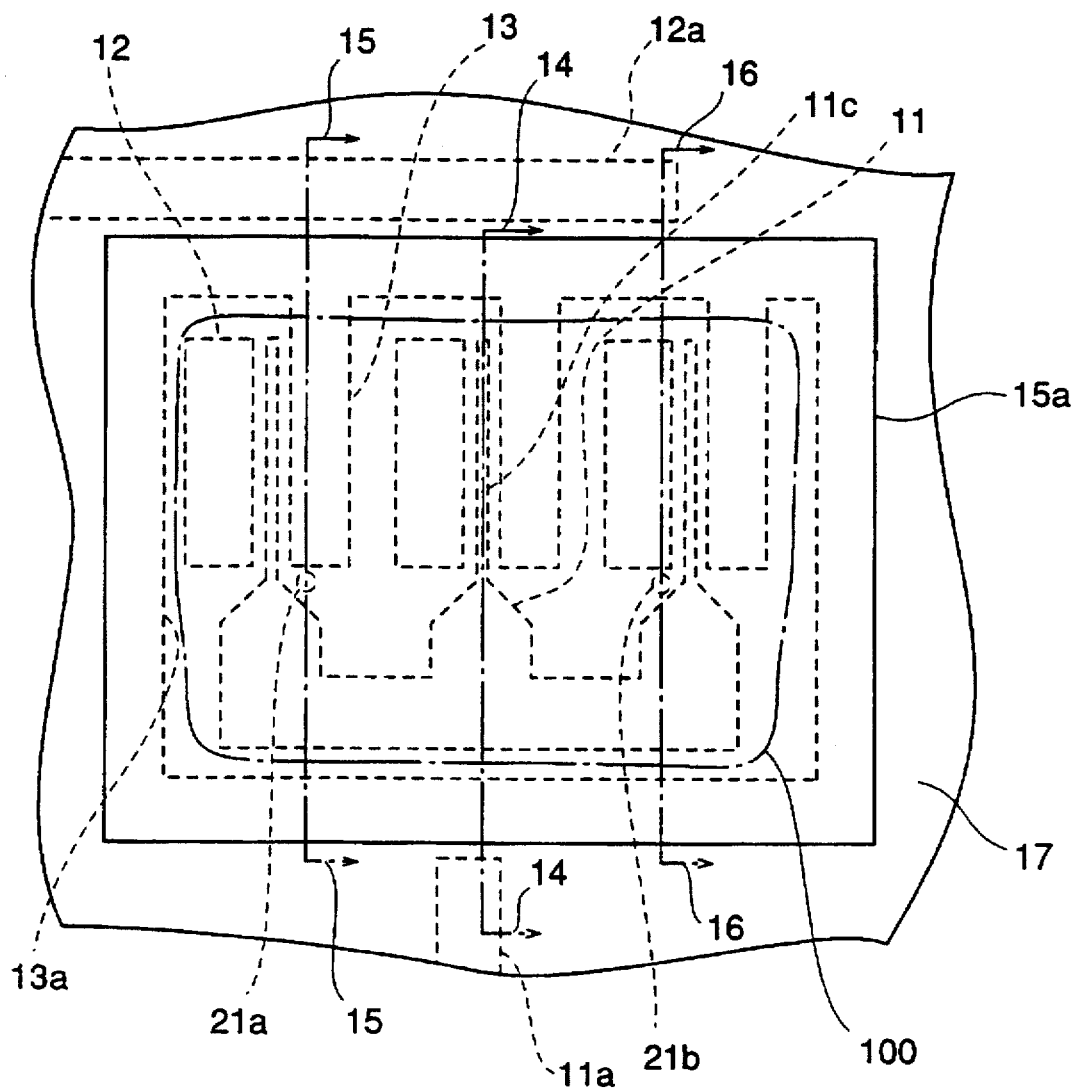
FIG. 13 is a perspective plan view illustrating an FET included in an MMIC and a peripheral region thereof in accordance with a third embodiment of the present invention.
Figure 14:
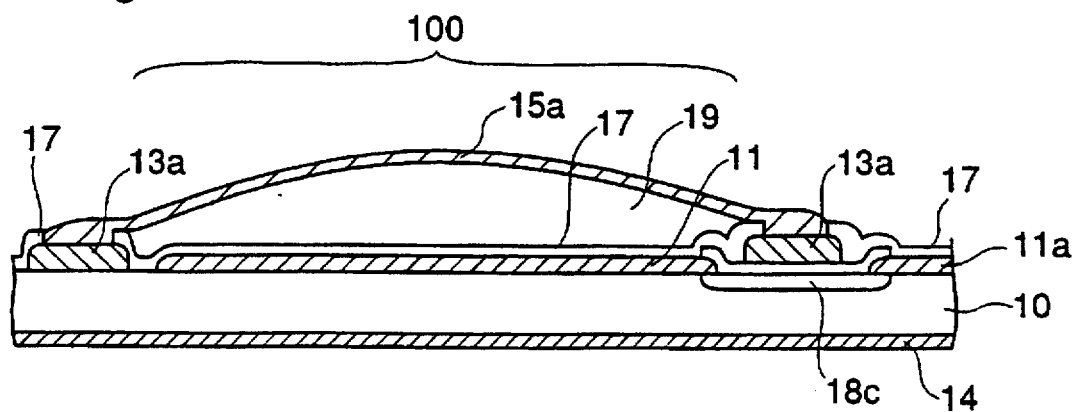
FIG. 14 is a cross-sectional view taken along a line 14—14 in FIG. 13.
Figure 15:
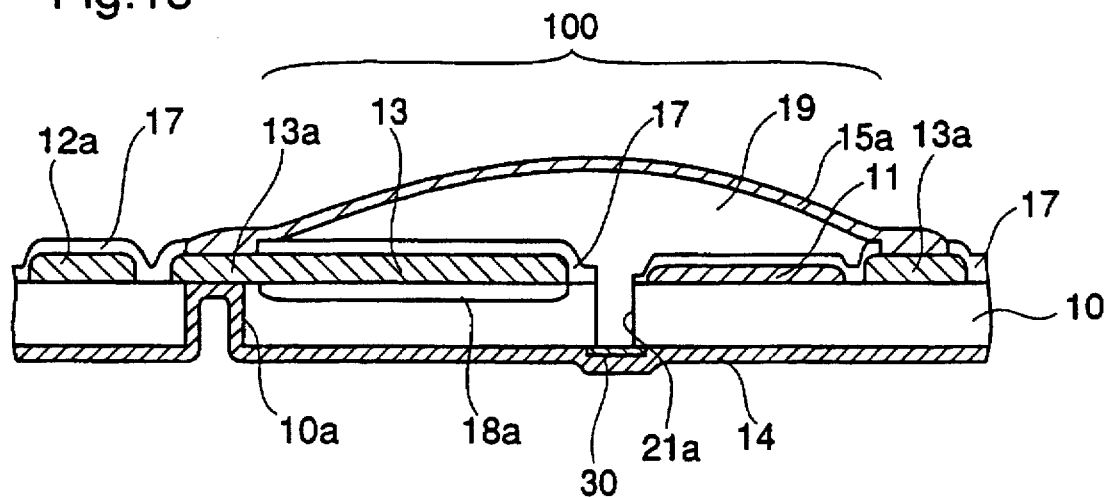
FIG. 15 is a cross-sectional view taken along a line 15—15 in FIG. 13.
Figure 16:
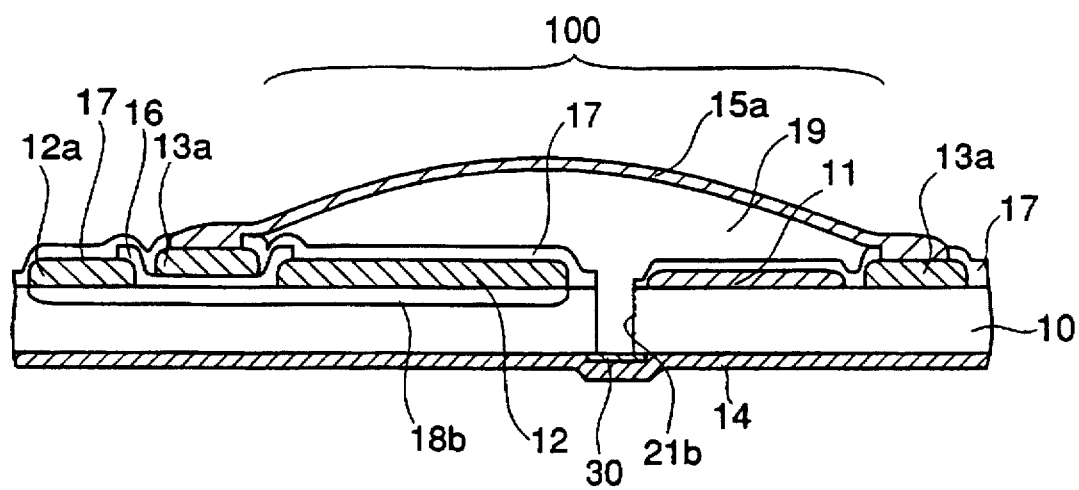
FIG. 16 is a cross-sectional view taken along a line 16—16 in FIG. 13.

FIG. 13 is a perspective plan view illustrating an FET included in an MMIC and a peripheral region thereof according to a third embodiment of the present invention. FIGS. 14, 15, and 16 are cross-sectional views taken along lines 14—14, 15—15, and 16—16 in FIG. 13, respectively. In these figures, the same reference numerals as those in FIGS. 1 to 4 designate the same or corresponding parts.

Since the operation of the MMIC according to this third embodiment is identical to the operation of the MMIC according to the first embodiment, repeated description is not necessary.

A description is given of the fabricating process.

Figure 17:
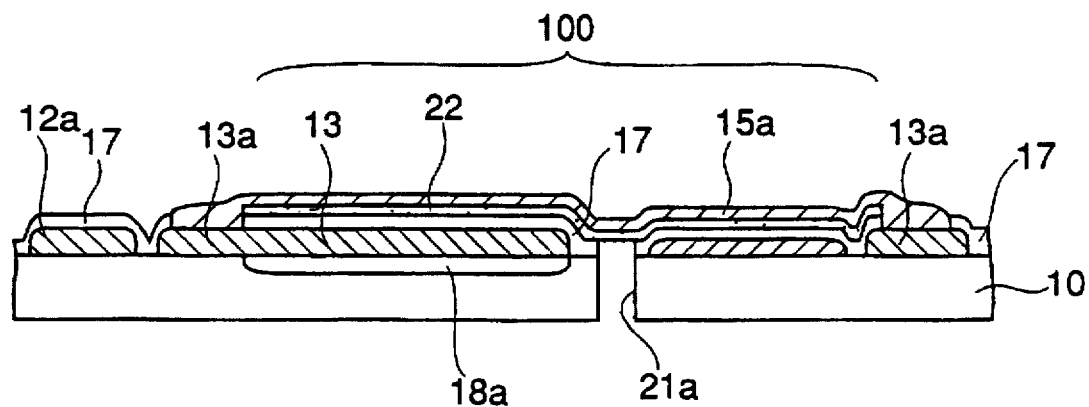
FIGS. 17 and 18 are cross-sectional views illustrating process steps in a method of fabricating the MMIC in accordance with the third embodiment of the present invention.
Figure 18:
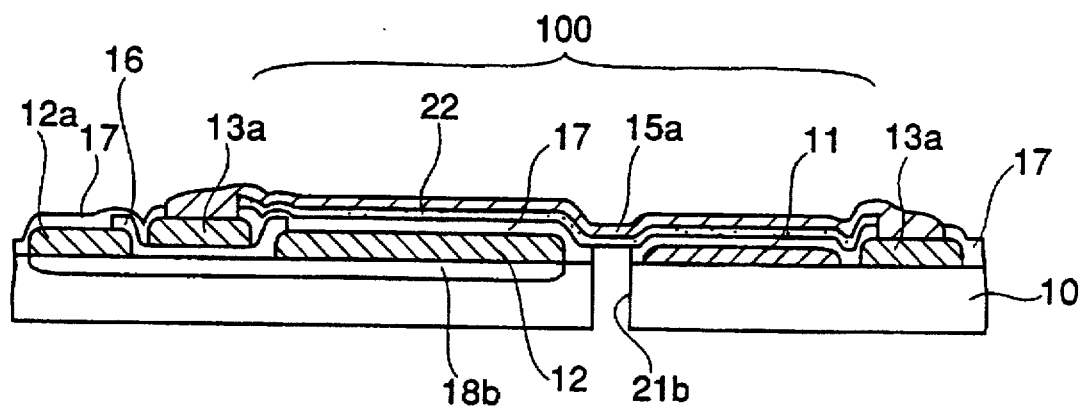

FIGS. 17 and 18 are cross-sectional views taken along the lines 15—15 and 16—16 in FIG. 13, respectively, illustrating process steps in a method of fabricating the MMIC.

Initially, as in the fabricating process of an MMIC according to the first embodiment of the invention, an $SiO_2$ film 17 is formed and a portion of the $SiO_2$ film 17 on the source electrode wiring 13a is selectively etched and removed.

Thereafter, a thin resist film 22 is selectively formed on a portion of the $SiO_2$ film 17 covering the FET 100, i.e., a portion surrounded by the exposed source electrode wiring 13a.

Then, a metal film comprising Ti(10–200 Å)/Au(1 μm) is formed by vapor deposition, and this metal film is etched and removed except a portion covering the FET 100 and a portion contacting the exposed surface of the source electrode wiring 13a, thereby producing an FET protecting metal film 15a.

Next, prescribed portions of the GaAs substrate 10 and the $SiO_2$ film 17 between the gate electrode 11 and the source electrode 13 and between the gate electrode 11 and the drain electrode 12 are etched from the rear surface of the substrate 10 to form holes 21a and 21b penetrating through the substrate 10 and the $SiO_2$ film 17 and reaching the thin resist film 22, resulting in the structure shown in FIGS. 5 and 6.

Next, a solvent that can dissolve the resist film 22 is injected into one of the holes 21a and 21b and discharged from the other of the holes to completely remove the thin resist film 22, whereby a space is produced between the FET protecting metal film 15a and the SiO$_2$ film 17.

Then, a high-pressure gas is injected into the space between the FET protecting metal film 15a and the SiO$_2$ film 17 from the holes 21a and 21b to expand the FET protecting metal film 15a like a dome as shown in FIGS. 14 to 16.

Then, a thin metal film 30 is bonded to the rear surface of the GaAs substrate 10 to close the openings of the holes 21a and 21b. Thereafter, a contact hole 10a is formed in a prescribed region of the GaAs substrate 10 from the rear surface of the substrate and a grounding conductor 14 is formed on the rear surface of the GaAs substrate 10, resulting in an MMIC shown in FIGS. 13 to 16 according to the third embodiment of the invention.

Also in the above-described fabricating process, the FET protecting metal film 15a that protects the FET 100 from the environment and electromagnetically shields the FET 100 is produced in a wafer stage. Therefore, an MMIC that operates as stably as the prior art MMIC sealed in the metal base package for protection from the environment and for electromagnetic shielding is fabricated in a relatively simple process, compared to the prior art process, without using expensive parts.

[Embodiment 4]

In the third embodiment of the invention, the FET protecting metal film 15a is expanded by injecting a high-pressure gas into the space between the FET protecting metal film 15a and the SiO$_2$ film 17 from the holes 21a and 21b and, thereafter, the openings of the holes 21a and 21b at the rear surface of the substrate 10 are closed with the thin metal film 22. In this fourth embodiment of the invention, the openings of the holes 21a and 21b at the rear surface of the substrate 10 are closed with the thin metal film 22 immediately after the formation of the space between the FET protecting metal film 15a and the SiO$_2$ film 17 and, thereafter, the FET protecting metal film 15 is expanded by heating the substrate 10 to expand air in the space.

Also in this fourth embodiment of the invention, an MMIC having the same structure and operation as the MMIC according to the third embodiment of the invention is obtained. That is, an MMIC that operates as stably as the prior art MMIC sealed in the metal base package for protection from the environment and for electromagnetic shielding is obtained in a relatively simple process, compared to the prior art process, without using expensive parts.

[Embodiment 5]

Figure 19:
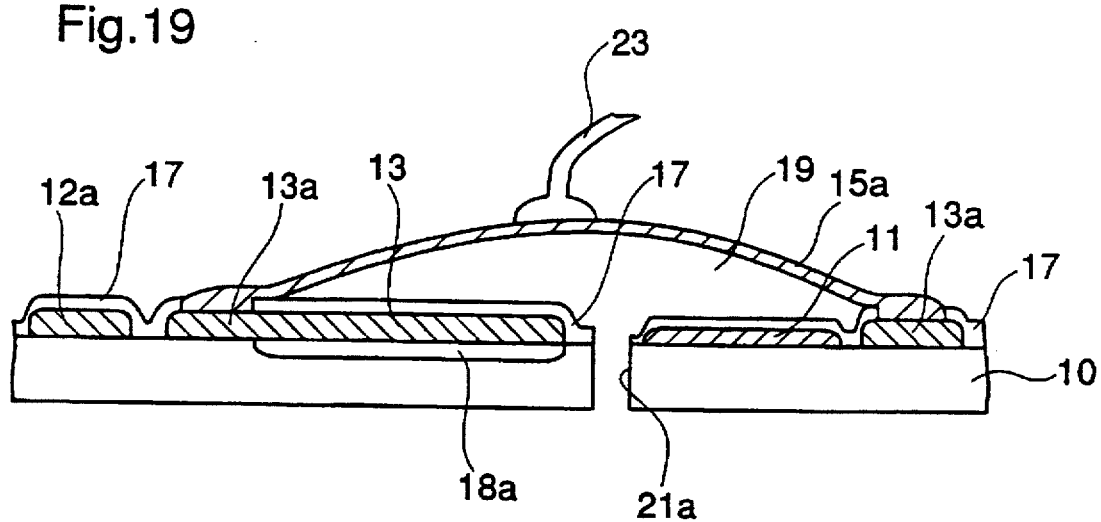
FIG. 19 is a cross-sectional view illustrating a process step in a method of fabricating an MMIC in accordance with a fifth embodiment of the present invention.

FIG. 19 is a cross-sectional view illustrating a process step in a method of fabricating an MMIC in accordance with a fifth embodiment of the present invention. In the figure, the same reference numerals as in FIG. 15 designate the same or corresponding parts. Reference numeral 23 designates a wire. The structure of the MMIC shown in FIG. 19 is identical to the MMIC according to the third embodiment of the invention, and FIG. 19 is a cross-sectional view taken along the line 15—15 in FIG. 13.

After removal of the thin resist film 22 with a solvent applied to the resist film 22 through the holes 21a and 21b, as illustrated in FIG. 19, a wire 23 is bonded to the upper surface of the FET protecting metal film 15a and this wire 23 is pulled up with a force of 2-5 gram, whereby the FET protecting metal film 15a is expanded. Thereafter, the holes 21a and 21b are sealed with thin metal films 30, the contact hole 10a is formed penetrating through the substrate 10, and the grounding conductor 14 is formed on the rear surface of the substrate 10.

Also in this fifth embodiment of the invention, an MMIC having the same structure and operation as those of the MMIC according to the third embodiment is obtained. That is, an MMIC that operates as stably as the prior art MMIC sealed in the metal base package for protection from the environment and for electromagnetic shielding is obtained in relatively simple process, compared to the prior art process, without using expensive parts.

[Embodiment 6]

Figure 21:
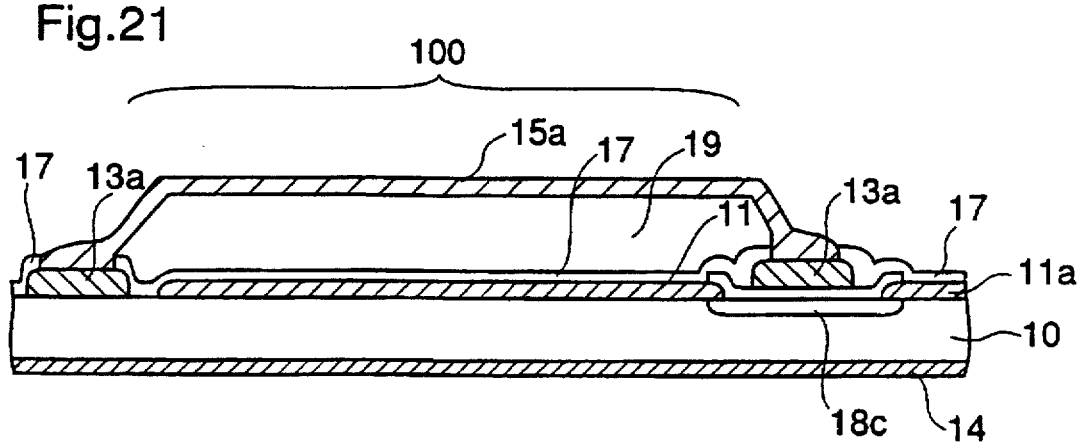
FIG. 21 is a cross-sectional view taken along a line 21—21 in FIG. 20.
Figure 22:
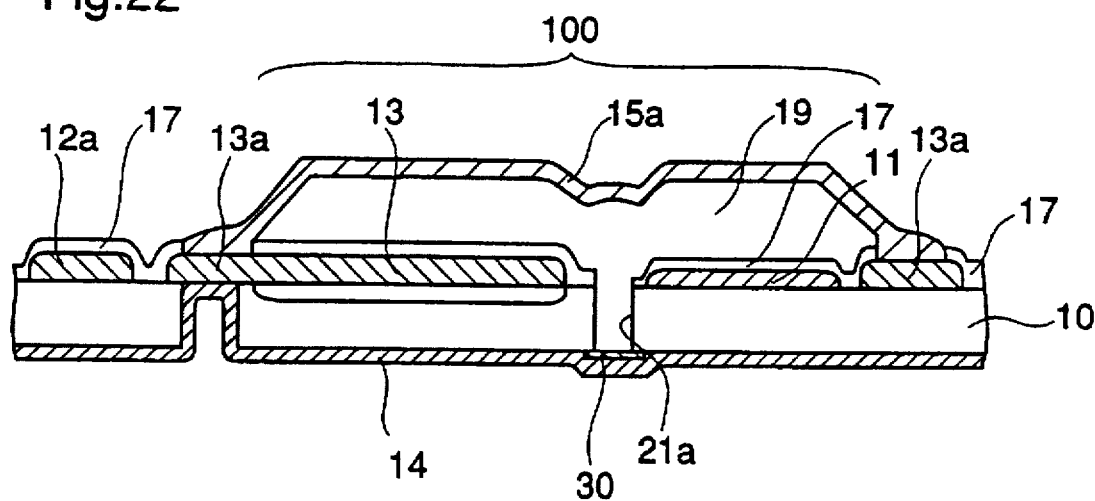
FIG. 22 is a cross-sectional view taken along a line 22—22 in FIG. 20.
Figure 23:
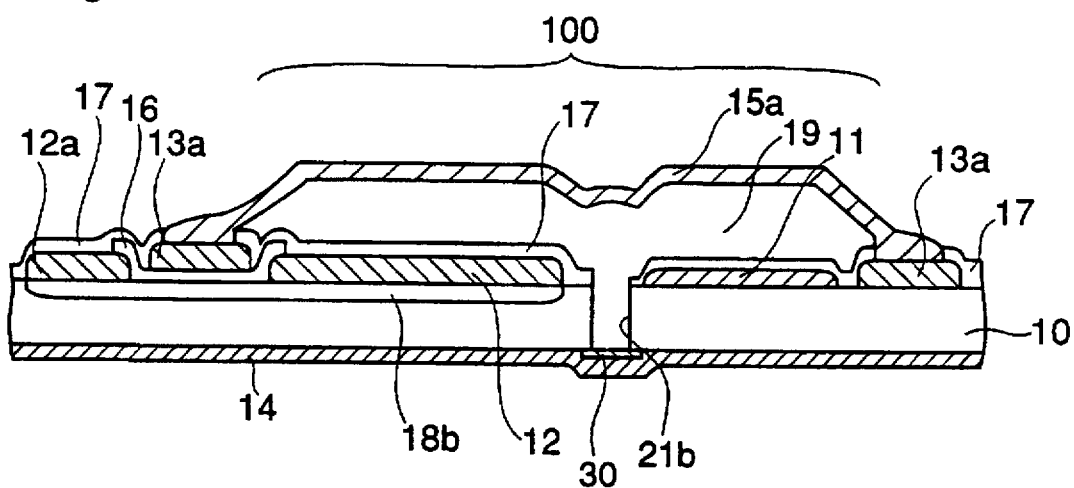
FIG. 23 is a cross-sectional view taken along a line 23—23 in FIG. 20.

FIG. 20 is a perspective plan view illustrating an FET included in an MMIC and a peripheral region thereof in accordance with a sixth embodiment of the present invention. FIGS. 21, 22, and 23 are cross-sectional views taken along lines 21—21, 22—22, and 23—23 in FIG. 20, respectively. In these figures, the same reference numerals as those in FIGS. 1 to 7 designate the same or corresponding parts. The structure of this MMIC is fundamentally identical to the MMIC according to the third embodiment of the invention except for the shape of the FET protecting metal film 15a.

Since the operation of the MMIC according to this sixth embodiment is identical to the operation of the MMIC according to the first embodiment, repeated description is not necessary.

Figure 24:
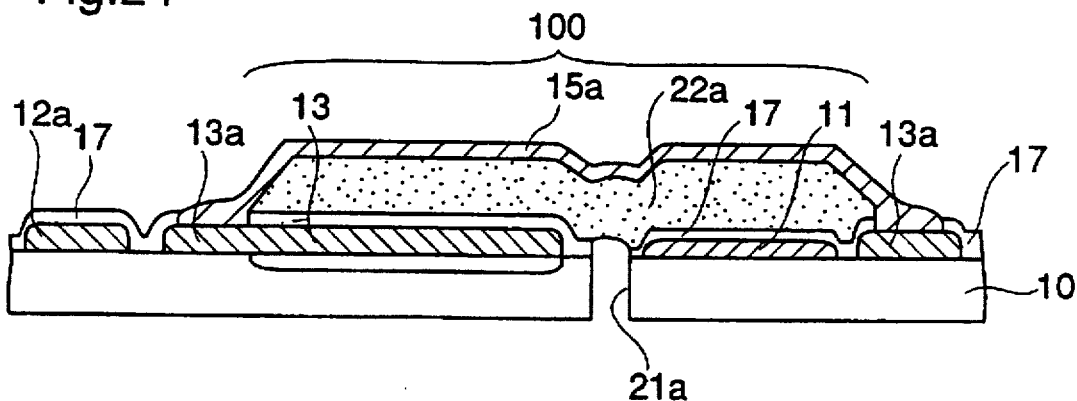
FIGS. 24 and 25 are cross-sectional views illustrating process steps in a method of fabricating the MMIC according to the sixth embodiment of the present invention.
Figure 25:
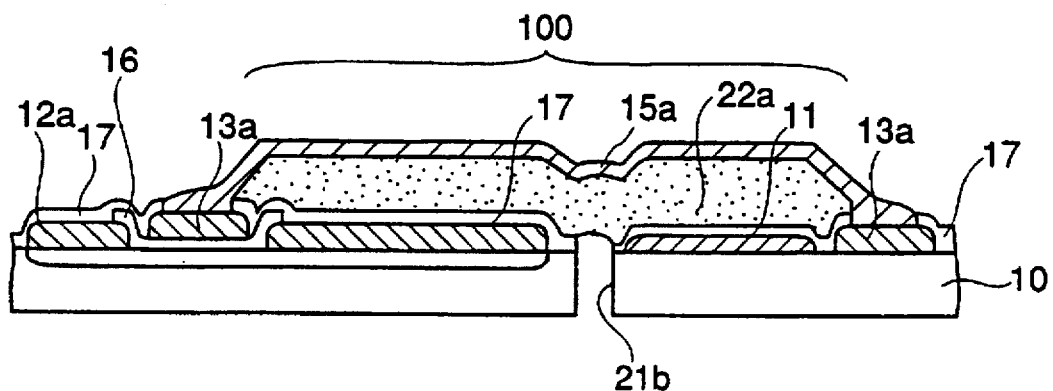

A description is given of the fabricating process. FIGS. 24 and 25 are cross-sectional views taken along the line 23—23 in FIG. 20, illustrating process steps in a method of fabricating the MMIC. In these figures, reference numeral 22a designates a thin resist film.

The process steps until the formation of the SiO$_2$ film 17 and the selective etching of a portion of the SiO$_2$ film 17 on the source electrode wiring 13a are identical to those already described for the first embodiment of the invention.

Then, a resist film 22a is formed on a portion of the SiO$_2$ film 17 covering the FET 100, i.e., a portion surrounded by the exposed source electrode wiring 13a. The thickness of the resist film 22a is selected such that the space between the gate electrode 11 of the FET 100 and the FET protecting metal film 15a which is later formed does not cause parasitic capacitance, i.e., gate to source capacitance, between the gate electrode 11 and the FET protecting metal film 15.

Thereafter, a metal film comprising Ti(10–200 Å)/Au(1 µm) is formed by vapor deposition, and this metal film is etched and removed except for a portion contacting the exposed surface of the source electrode wiring 13a and a portion covering the FET 100, whereby the FET protecting metal film 15a is produced.

Next, prescribed portions of the GaAs substrate 10 and the SiO$_2$ film 17 between the gate electrode 11 and the source electrode 13 and between the gate electrode 11 and the drain electrode 12 are etched from the rear surface of the substrate 10 to form holes 21a and 21b penetrating through the substrate 10 and the SiO$_2$ film 17 and reaching the thin resist film 22a, resulting in the structure shown in FIGS. 24 and 25.

Next, a solvent that can dissolve the resist film 22a is injected into one of the holes 21a and 21b and discharged from the other of the holes to completely remove the resist film 22a, whereby a space 19 is produced between the FET protecting metal film 15a and the SiO$_2$ film 17.

Then, a thin metal film 30 is bonded to the rear surface of the GaAs substrate 10 to close the openings of the holes 21a and 21b at the rear surface of the substrate. Thereafter, a contact hole 10a is formed in a prescribed region of the GaAs substrate 10 from the rear surface of the substrate. Finally, a grounding conductor 14 is formed on the rear surface of the GaAs substrate 10 to complete the MMIC shown in FIGS. 20 to 23 according to this sixth embodiment of the invention.

Also in this sixth embodiment of the invention, since the FET protecting metal film 15a that protects the FET 100 from for environment and electromagnetically shields the FET 100 is produced in a wafer stage process, an MMIC that operates as stably as the prior art MMIC sealed in the metal base package for protection from the environment and for electromagnetic shielding is obtained in relatively simple process, compared to the prior art process, without using expensive parts. Further, since the space between the FET protecting metal film 15a and the gate electrode 11 of the FET 100 is determined by the thickness of the resist film 22a, the precision in making the space such that no parasitic resistance is produced between the FET protecting metal film 15a and the gate electrode 11 is higher than that in the case where the FET protecting metal film is expanded like a dome, whereby the fabrication efficiency is further improved.

[Embodiment 7]

Figure 26:
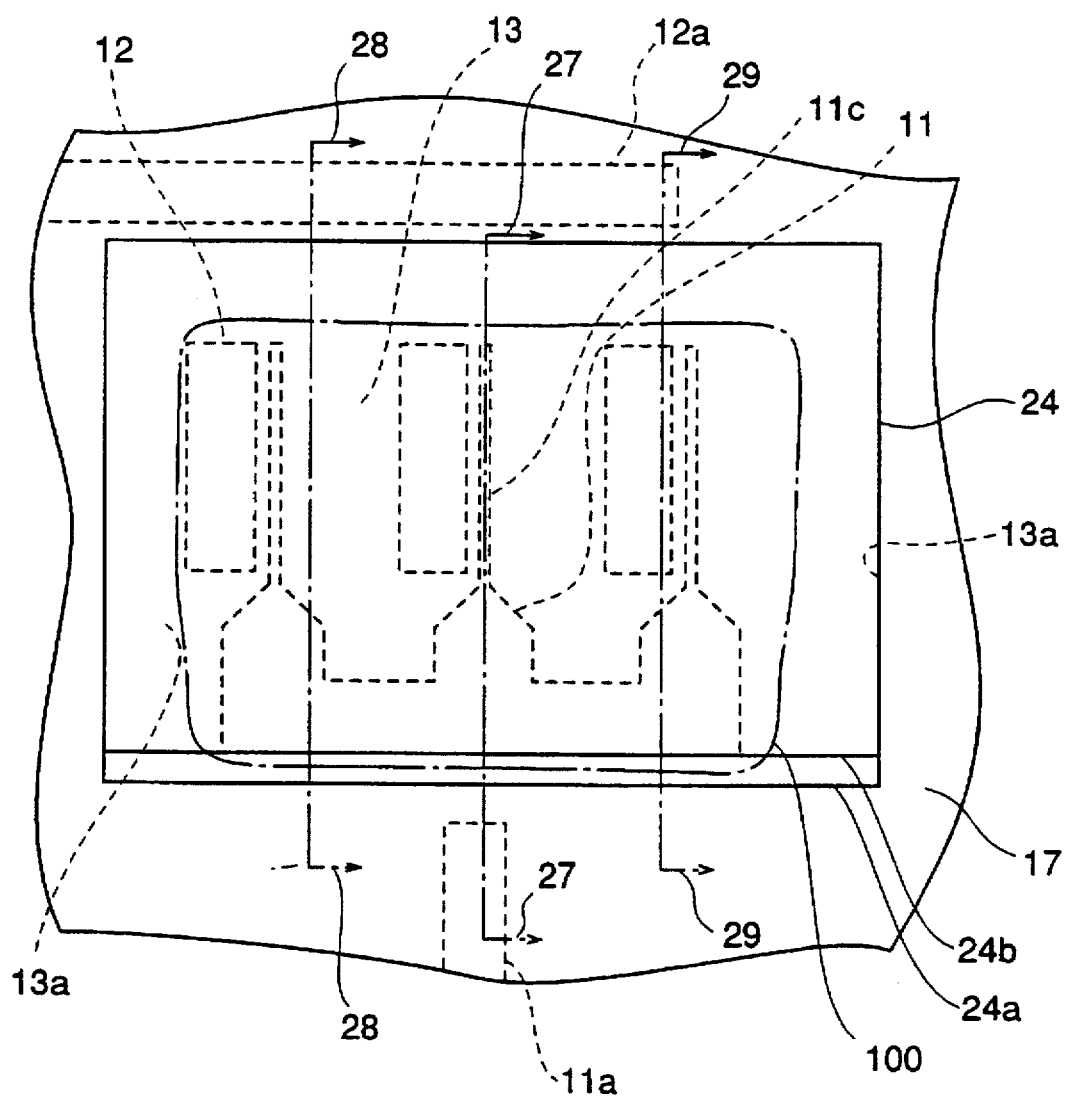
FIG. 26 is a perspective plan view illustrating an FET included in an MMIC and a peripheral region thereof in accordance with a seventh embodiment of the present invention.
Figure 27:
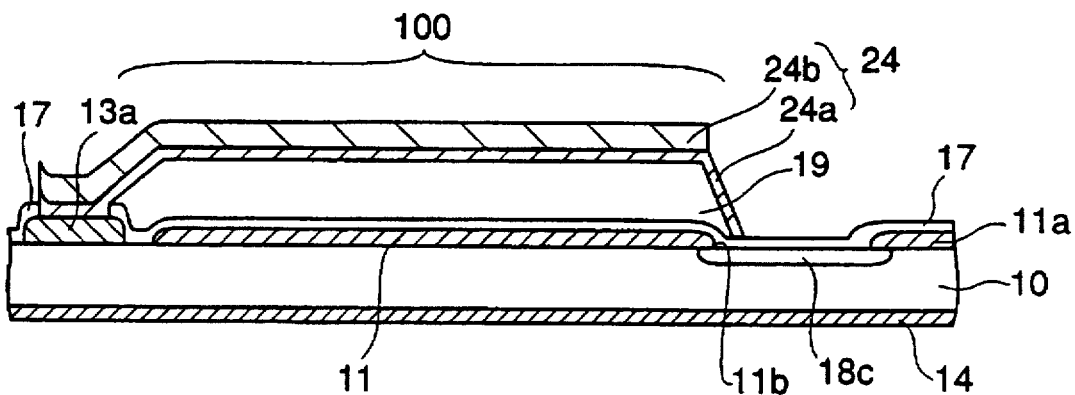
FIG. 27 is a cross-sectional view taken along a line 27—27 in FIG. 26.
Figure 28:
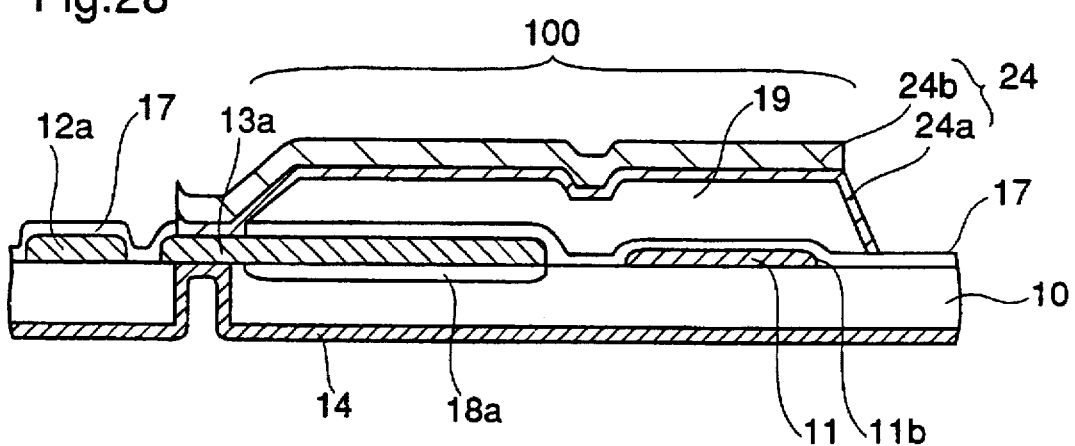
FIG. 28 is a cross-sectional view taken along a line 28—28 in FIG. 26.
Figure 29:
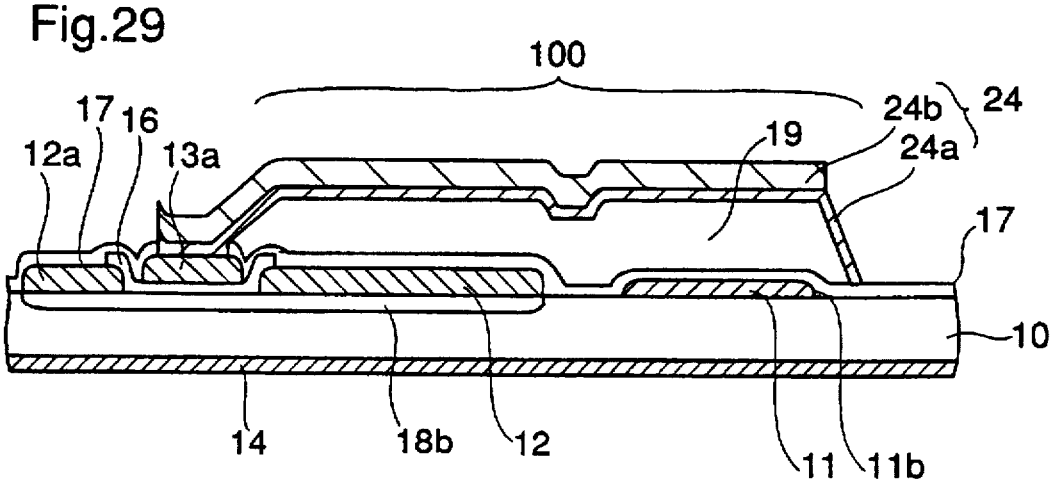
FIG. 29 is a cross-sectional view taken along a line 29—29 in FIG. 26.

FIG. 26 is a perspective plan view illustrating an FET included in an MMIC and a peripheral region thereof in accordance with a seventh embodiment of the present invention. FIGS. 27, 28, and 29 are cross-sectional views taken along lines 27—27, 28—28, and 29—29 in FIG. 26, respectively. In these figures, the same reference numerals as those in FIGS. 1 to 7 designate the same or corresponding parts. Reference numeral 11b designates an edge of the gate electrode 11, numeral 24 designates an FET protecting metal film, numeral 24a designates a vapor-deposited Ti film, and numeral 24b designates a plated Au film. While in the above-described first to sixth embodiments the source electrode wiring 13a surrounds the FET 100, in this seventh embodiment the source electrode wiring 13a is absent in the vicinity of the edge 11b of the gate electrode 11, i.e., the source electrode wiring 13a is shaped like Roman letter U.

Since the operation of the MMIC according to this seventh embodiment is identical to the operation of the MMIC according to the first embodiment, repeated description is not necessary.

Figure 30:
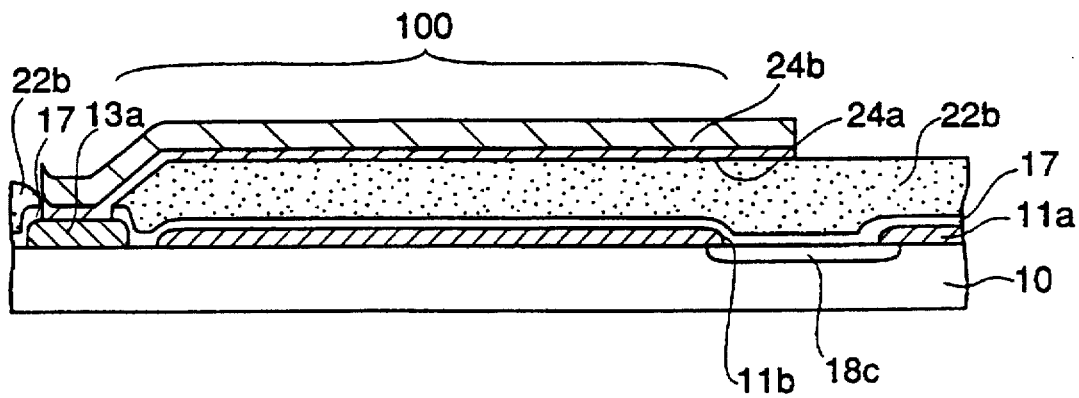
FIGS. 30, 31, and 32 are cross-sectional views illustrating process steps in a method of fabricating the MMIC according to the seventh embodiment of the present invention.
Figure 31:
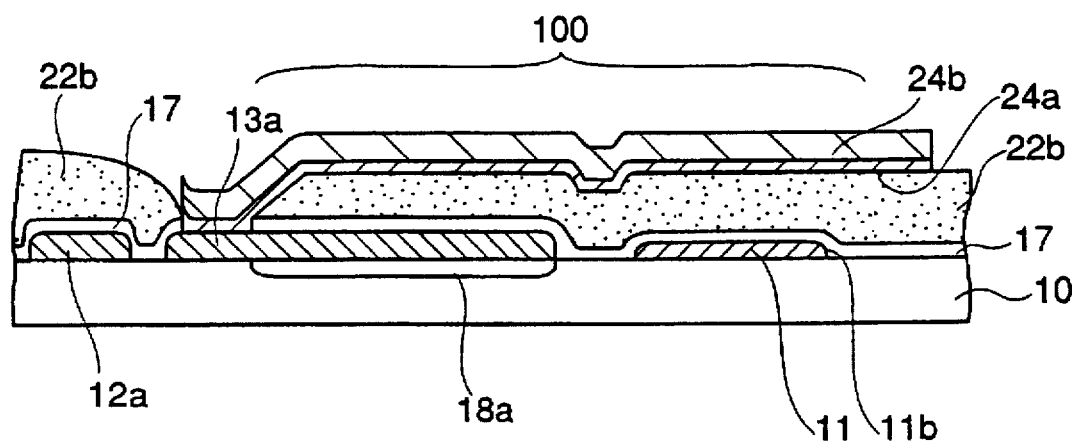
Figure 32:
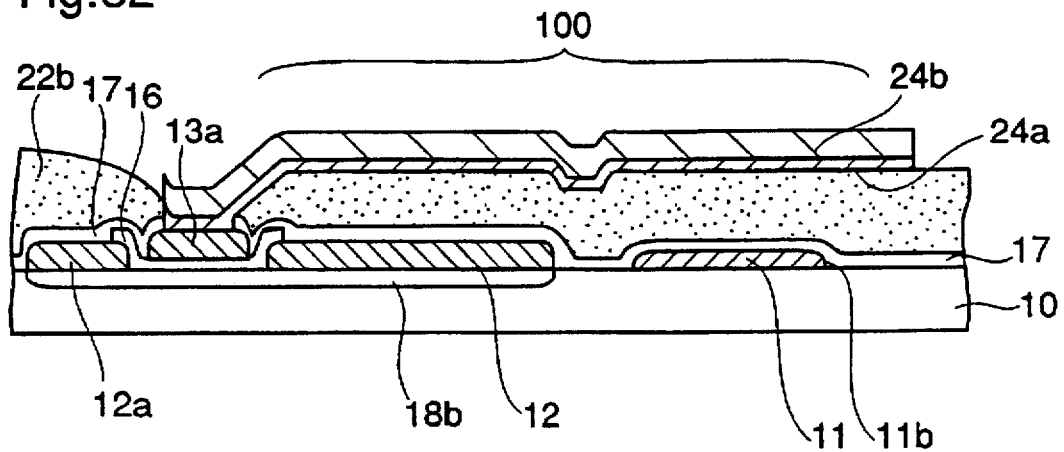

A description is given of the fabricating process. FIGS. 30, 31, and 32 are cross-sectional views taken along the lines 27—27, 28—28, and 29—29 in FIG. 26, respectively, illustrating process steps in a method of fabricating the MMIC.

The process steps until the formation of the SiO$_2$ film 17 and the selective etching of a portion of the SiO$_2$ film 17 on the source electrode wiring 13a are identical to those already described for the first embodiment of the invention. In this seventh embodiment, the source electrode wiring 13a is shaped like Roman letter U, and the SiO$_2$ film 16 is not formed on the n$^+$ diffused region 18c.

Then, a resist film 22b is formed on the surface of the SiO$_2$ film 17 left through the above-described process steps. The thickness of the resist film 22b is selected so that the space between the gate electrode 11 of the FET 100 and the FET protecting metal film 15a which is later formed does not cause parasitic capacitance, i.e., gate to source capacitance, between the gate electrode 11 and the FET protecting metal film 15a.

Next, 10–200 Å thick Ti film 24a is formed on the entire surface of the substrate 10, i.e., on the surface of the resist film 22b and on the exposed surface of the source electrode wiring 13a, by vapor deposition. Using this Ti film 24a as a feeding layer, a 1 µm thick Au film 24b is plated on the Ti film 24a by electroplating.

The Ti film 24a and the Au film 24b are selectively etched except for portions covering the exposed surface of the source electrode wiring 13a and the FET 100, resulting in the structure shown in FIGS. 30 to 32. In this structure, portions of the Ti film 24a and the Au film 24b covering the gate electrode 11 of the FET 100 protrude from the edge 11b of the gate electrode 11 by a length a little longer than the thickness of the resist film 22b.

Next, the portion of the Au film 24b protruding over the edge 11b of the gate electrode 11 is removed by ion milling, whereby an edge of the Au film 24b is aligned with the edge 11b of the gate electrode 11.

After removal of the resist film 22b with a solvent, the end portion of the Ti film 24a is bent using a water spray or the like to contact the end portion to the surface of the SiO$_2$ film 17. Thereafter, a contact hole 10a is formed in a prescribed region of the GaAs substrate 10 from the rear surface of the substrate, and a grounding conductor 14 is formed on the rear surface of the GaAs substrate 10, thereby completing the MMIC shown in FIGS. 26 to 29 according to the seventh embodiment of the invention.

Also in this seventh embodiment of the invention, since the FET protecting metal film 15a that protects the FET 100 from the environment and electromagnetically shields the FET 100 is produced in a wafer stage process, an MMIC that operates as stably as the prior art MMIC sealed in the metal base package for protection from the environment and for electromagnetic shielding is obtained in relatively simple process, compared to the prior art process, without using expensive parts. In addition, since the resist film 22b can be removed without providing holes in the substrate 10, the fabricating process is simplified and the fabrication efficiency is significantly increased. Further, since the space between the FET protecting metal film 15a and the gate electrode 11 of the FET 100 is determined by the thickness of the resist film 22a, the precision in making the space such that no parasitic resistance is produced between the FET protecting metal film 15a and the gate electrode 11 is higher than that in the case where the FET protecting metal film is expanded like a dome, whereby the fabrication efficiency is further improved.

[Embodiment 8]

Figure 33:
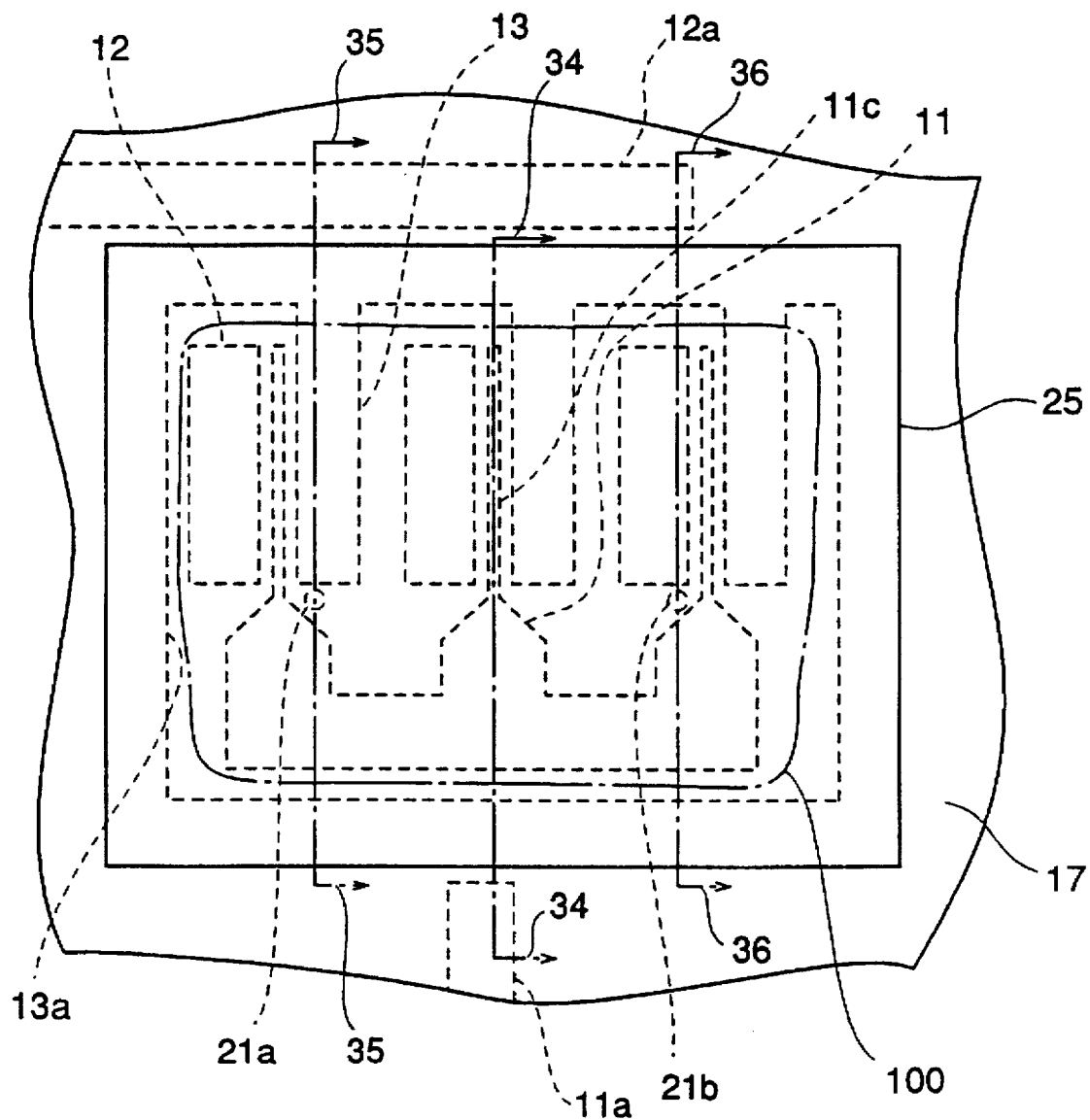
FIG. 33 is a perspective plan view illustrating an FET included in an MMIC and a peripheral region thereof in accordance with an eighth embodiment of the present invention.
Figure 34:
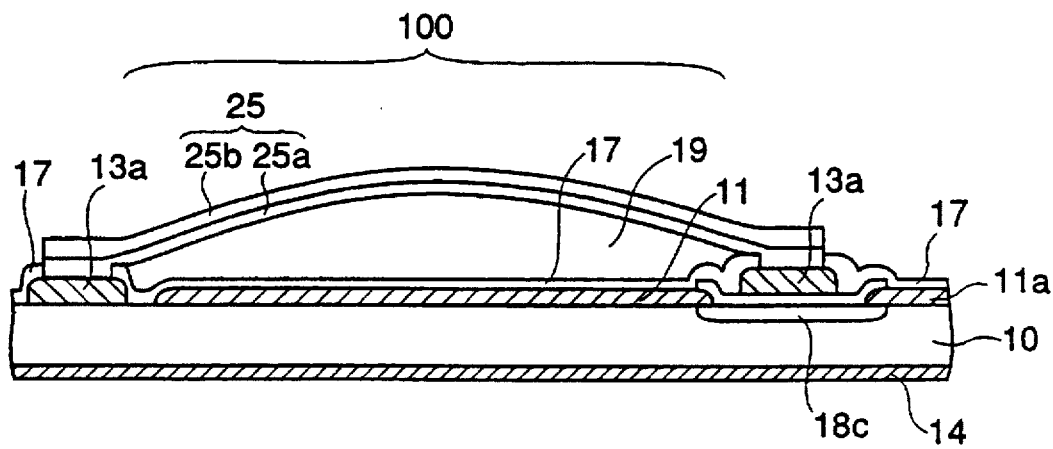
FIG. 34 is a cross-sectional view taken along a line 34—34 in FIG. 33.
Figure 35:
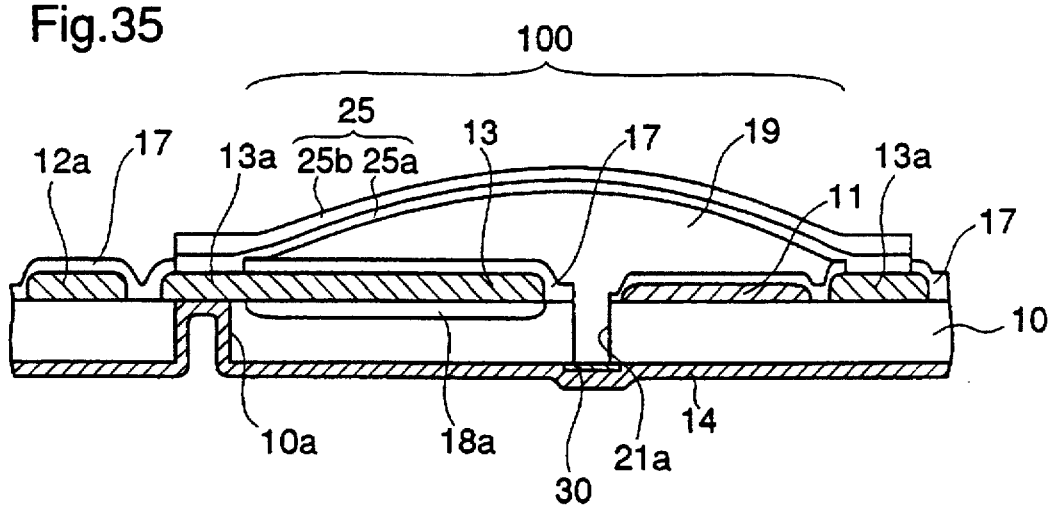
FIG. 35 is a cross-sectional view taken along a line 35—35 in FIG. 33.
Figure 36:
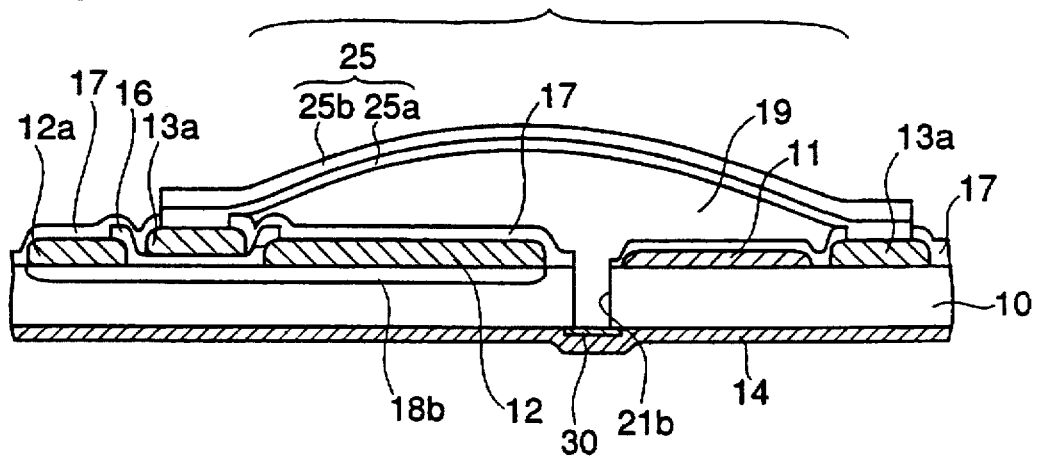
FIG. 36 is a cross-sectional view taken along a line 36—36 in FIG. 33.
Figure 37:
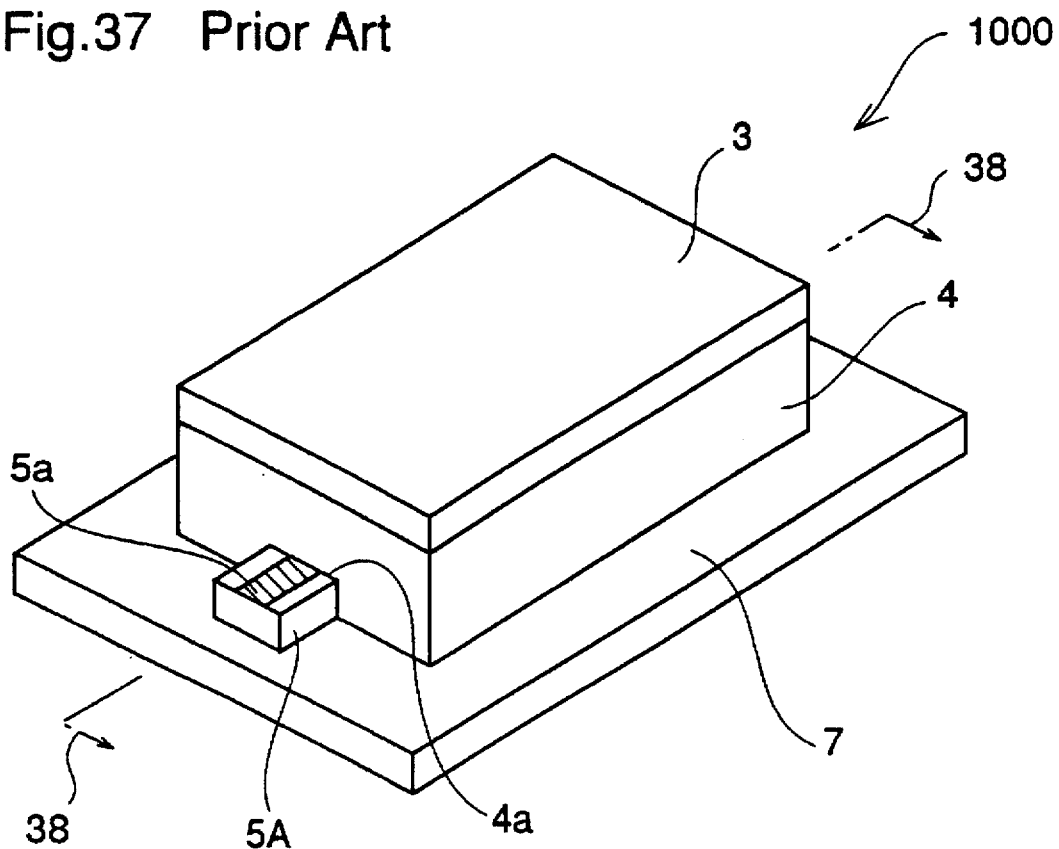
FIG. 37 is a perspective view illustrating an MMIC in which an MMIC chip is sealed in a metal base package according to the prior art.
Figure 38:
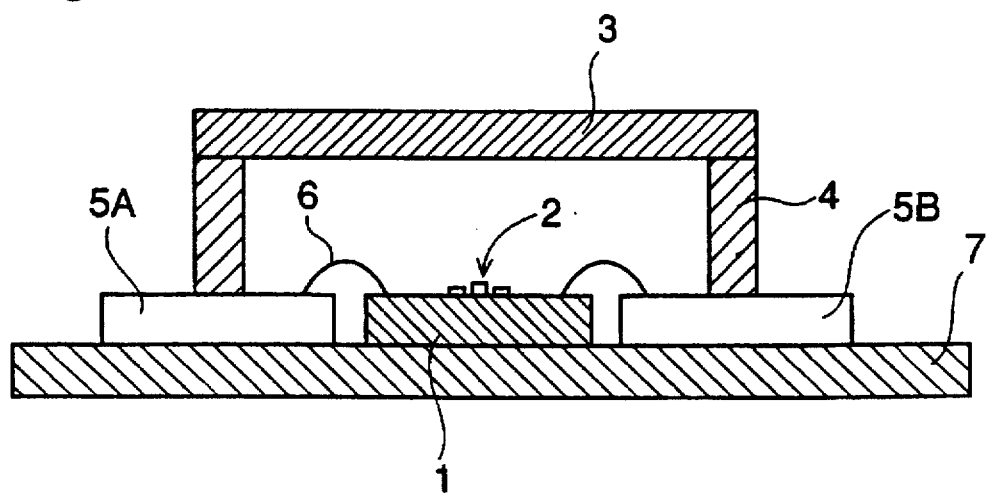
FIG. 38 is a cross-sectional view taken along a line 38—38 in FIG. 37.

FIG. 33 is a perspective plan view illustrating an FET included in an MMIC and a peripheral region thereof in accordance with an eighth embodiment of the present invention. FIGS. 34, 35, and 36 are cross-sectional views taken along lines 34—34, 35—35, and 36—36 in FIG. 33, respectively. In these figures, the same reference numerals as those in FIGS. 1 to 4 designate the same or corresponding parts. Reference numeral 25 designates an FET protecting metal film, numeral 25a designates a vapor-deposited Ti film, and numeral 25b designates a vapor-deposited Au film.

Since the operation of the MMIC according to this eighth embodiment is identical to the operation of the MMIC according to the first embodiment, repeated description is not necessary.

The fabricating process of the MMIC according to this eighth embodiment is fundamentally identical to the fabricating process according to the first embodiment of the invention except that the electroless plating of the Pd/Ni/Au film according to the first embodiment is replaced with vapor deposition of a 10Å–1 µm thick Ti film 25a and 1 µm thick Au film 25b in this order under hydrogen ambient.

In the fabricating process according to this eighth embodiment, the Ti film 25a occludes a large quantity of hydrogen when it is deposited and discharges the hydrogen when it is heated at a temperature exceeding 200° C., whereby the FET protecting metal film 25 comprising the Ti film 25a and the Au film 25b is expanded like a dome. Therefore, also in this eighth embodiment of the invention, the same effects as described in the first embodiment are achieved.

17

[Embodiment 9]

In the above-described eighth embodiment of the invention, the Ti film 25a is vapor-deposited in a hydrogen ambient to make the Ti film 25a occlude hydrogen and, utilizing the hydrogen discharged from the Ti film 25a when it is heated, the Ti/Au FET protecting metal film 25 is expanded. However, a similar dome-shaped FET protecting metal film can be produced by heating only a Ti/Au metal film that is formed without occluding hydrogen.

In the fabricating method of an MMIC according to this ninth embodiment of the invention, the Ti/Au metal film 25 is formed by vapor deposition in an ambient that does not include hydrogen.

In the fabricating process, the difference in thermal expansion coefficients between Au and Ti is considerable (Au: $1.4 \times 10^{-5}$ at 200° C., Ti: $9 \times 10^{-6}$ at 200° C.). In addition, Au is poor in elasticity and, when Au is once deformed, it does not return to the former shape. Therefore, when the Ti/Au metal film 25 is heated at a temperature exceeding 200° C., the upper Au layer 25b is expanded more than the lower Ti film 25a, so that the Ti/Au film 25 is expanded like a dome. Therefore, also in this ninth embodiment of the invention, the same effects as described in the eighth embodiment are achieved. However, since it is difficult to accurately control the degree of the expansion of the metal film, the fabrication efficiency is reduced compared to that obtained in the eighth embodiment of the invention. While in the foregoing description an $SiO_2$ film is used as an insulating film, an SiN film may be used with the same effects as described above.

What is claimed is:

1. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin resist film on the insulating film covering the first region of the semiconductor substrate;

removing a portion of the insulating film from the second region of the semiconductor substrate opposite the wiring;

forming a metal film containing a gas and discharging the gas by heat treatment, covering the thin resist film and contacting, at a peripheral portion, the wiring that is exposed by removal of the insulating film;

forming a hole in a region of the semiconductor substrate from the rear surface of the semiconductor substrate to reach the thin resist film;

forming a space between the metal film and the insulating film by dissolving and removing the thin resist film with a solvent applied to the resist film through the hole;

closing the opening of the hole at the rear surface of the semiconductor substrate and;

heating the metal film to discharge the gas, thereby expanding the metal film to such an extent that a space produced between the metal film and the gate electrode of the FET does not cause parasitic capacitance between the metal film and the gate electrode.

2. The method of claim 1 including:

forming the metal film by selectively electroless plating a Pd/Ni/Au film on the insulating film.

3. The method of claim 1 including:

vapor depositing the metal film by selectively forming a Ti/Au layer on the insulating film in a hydrogen ambient.

4. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin film comprising one selected from a semiconductor and an organic substance on part of the insulating film covering the first region of the semiconductor substrate, said thin film containing a gas and discharging the gas in a heat treatment;

forming a thin resist film on the thin semiconductor or organic substrate film;

removing a portion of the insulating film from the second region of the semiconductor substrate opposite the wiring;

forming a metal film covering the thin resist film and contacting, at a peripheral portion, the wiring exposed by removal of the insulating film;

forming a hole in a region of the semiconductor substrate from the rear surface of the semiconductor substrate to reach the thin resist film;

forming a space between the metal film and the thin film by dissolving and removing the thin resist film with a solvent applied to the resist film through the hole;

closing the opening of the hole at the rear surface of the semiconductor substrate and;

heating the thin substance film to discharge the gas, thereby expanding the metal film to such an extent that a space produced between the metal film and the gate electrode of the FET does not cause parasitic capacitance between the metal film and the gate electrode.

5. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin resist film on the insulating film covering the first region of the semiconductor substrate;

removing a portion of the insulating film from the second region of the semiconductor substrate opposite the wiring;

forming a metal film covering the thin resist film and contacting, at a peripheral portion, the wiring exposed by removal of the insulating film;

forming a hole in a region of the semiconductor substrate from the rear surface of the semiconductor substrate to reach the thin resist film;

forming a space between the metal film and the insulating film by dissolving and removing the thin resist film with a solvent applied to the resist film through the hole;

injecting a high-pressure gas into the space through the hole, thereby expanding the metal film to an extent that a space produced between the metal film and the gate electrode of the FET does not cause parasitic capacitance between the metal film and the gate electrode; and closing the opening of the hole at the rear surface of the semiconductor substrate.

6. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin resist film on the insulating film covering the first region of the semiconductor substrate;

removing a portion of the insulating film from the second region of the semiconductor substrate and opposite to the wiring;

forming a metal film covering the thin resist film and contacting, at a peripheral portion, the wiring exposed by removal of the insulating film;

forming a hole in a region of the semiconductor substrate from the rear surface of the semiconductor substrate to reach the thin resist film;

forming a space between the metal film and the insulating film by dissolving and removing the thin resist film with a solvent applied to the resist film through the hole;

closing the opening of the hole at the rear surface of the semiconductor substrate and;

heating the substrate to expand the space between the metal film and the insulating film, thereby expanding the metal film to such an extent that a space produced between the metal film and the gate electrode of the FET does not cause parasitic capacitance between the metal film and the gate electrode.

7. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin resist film on the insulating film covering the first region of the semiconductor substrate;

removing a portion of the insulating film from the second region of the semiconductor substrate opposite the wiring;

forming a metal film covering the thin resist film and contacting, at a peripheral portion, the wiring exposed by removal of the insulating film;

forming a hole in a region of the semiconductor substrate from the rear surface of the semiconductor substrate to reach the thin resist film;

forming a space between the metal film and the insulating film by dissolving and removing the thin resist film with a solvent applied to the resist film through the hole;

bonding a wire to the metal film and pulling the wire to expand the metal film to such an extent that a space produced between the metal film and the gate electrode of the FET does not cause parasitic capacitance between the metal film and the gate electrode; and closing the opening of the hole at the rear surface of the semiconductor substrate.

8. A method of fabricating a microwave semiconductor integrated circuit comprising:

preparing a semiconductor substrate having opposite front and rear surfaces;

fabricating an integrated circuit including an FET having a gate electrode as a circuit element and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a resist film on part of the insulating film covering the first region of the semiconductor substrate, said resist film having a thickness that provides a space between the gate electrode of the FET and a metal film that does not cause parasitic capacitance between the gate electrode and the metal film;

removing a portion of the insulating film from the second region of the semiconductor substrate opposite the wiring;

forming the metal film covering the thin resist film and contacting, at a peripheral portion, the wiring that is exposed by removal of the insulating film;

forming a hole in a region of the semiconductor substrate from the rear surface of the semiconductor substrate to reach the thin resist film;

forming a space between the metal film and the insulating film by dissolving and removing the thin resist film with a solvent applied to the resist film through the hole; and closing the opening of the hole at the rear surface of the semiconductor substrate.

9. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a resist film on part of the insulating film other than on the wiring, said resist film having a thickness that provides a space between the gate electrode of the FET and a thin first metal film that does not cause parasitic capacitance between the gate electrode and the metal film;

using the resist film as a mask, removing a portion of the insulating film from the wiring;

forming a thin first metal film on the resist film and on the wiring exposed by removal of the insulating film by vapor deposition and, thereafter, forming a thick second metal film by electroplating using the first metal film as a feeding layer;

patterning the first and second metal films to be larger than the first region of the semiconductor substrate;

removing a peripheral portion of the patterned second metal film, outside the first region of the substrate and not located on the wiring;

dissolving and removing the resist film with a solvent; and bending a peripheral portion of the first metal film not located within the first region of the substrate to make a closed space between the insulating film and the first metal film.

10. A method of fabricating a microwave semiconductor integrated circuit comprising:

preparing a semiconductor substrate having opposite front and rear surfaces;

fabricating an integrated circuit including an FET having a gate electrode and a wiring surrounding the FET on the front surface of the semiconductor substrate, said FET being fabricated on a first region of the semiconductor substrate and said wiring being fabricated on a second region of the semiconductor substrate surrounding the first region;

forming an insulating film covering the first region of the semiconductor substrate and the second region of the semiconductor substrate;

forming a thin resist film on a portion of the insulating film covering the first region of the substrate;

forming a metal film pattern comprising a first metal film having a thermal expansion coefficient and a second metal film having a thermal expansion coefficient larger than that of the first metal film covering the thin resist film and contacting, at a peripheral portion, the wiring exposed by the removal of the insulating film;

forming a hole in a region of the semiconductor substrate from the rear surface of the semiconductor substrate to reach the thin resist film;

forming a space between the metal film pattern and the insulating film by dissolving and removing the thin resist film with a solvent applied to the resist film through the hole;

closing the opening of the hole at the rear surface of the semiconductor substrate; and heating the metal film pattern to expand the metal film pattern to such an extent that a space produced between the metal film pattern and the gate electrode of the FET does not cause parasitic resistance between the metal film pattern and the gate electrode.

* * * * *

UNITED STATES PATENT AND TRADEMARK OFFICE
CERTIFICATE OF CORRECTION

PATENT NO. : 5,698,462
DATED : December 16, 1997
INVENTOR(S) : Sasaki

It is certified that error appears in the above-indentified patent and that said Letters Patent is hereby corrected as shown below:

Column 17, Line 64, change "and;" to --;and--;

Column 18, Line 46, change "and;" to --;and--;

Line 47, delete --substance--;

Column 19, Line 54, change "and;" to --;and--.

Signed and Sealed this

Twenty-third Day of June, 1998

Attest:

BRUCE LEHMAN

*Attesting Officer*       *Commissioner of Patents and Trademarks*